US009799654B2

(12) United States Patent
Ok et al.

(10) Patent No.: US 9,799,654 B2
(45) Date of Patent: Oct. 24, 2017

(54) FET TRENCH DIPOLE FORMATION

(71) Applicant: International Business Machines Corporation, Armonk, NY (US)

(72) Inventors: Injo Ok, Loudonville, NY (US); Balasubramanian Pranatharthiharan, Watervliet, NY (US); Soon-Cheon Seo, Glenmont, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 14/742,957

(22) Filed: Jun. 18, 2015

(65) Prior Publication Data
US 2016/0372470 A1    Dec. 22, 2016

(51) Int. Cl.
| H01L 21/00 | (2006.01) |
| H01L 27/00 | (2006.01) |
| H01L 27/092 | (2006.01) |
| H01L 21/8238 | (2006.01) |
| H01L 29/66 | (2006.01) |
| H01L 29/423 | (2006.01) |

(52) U.S. Cl.
CPC .. *H01L 27/0924* (2013.01); *H01L 21/823821* (2013.01); *H01L 21/823857* (2013.01); *H01L 29/4232* (2013.01); *H01L 29/66545* (2013.01)

(58) Field of Classification Search
CPC ........... H01L 29/4232; H01L 29/66545; H01L 27/0924; H01L 27/0922; H01L 21/02233; H01L 21/823821; H01L 21/823828
See application file for complete search history.

(56) References Cited

U.S. PATENT DOCUMENTS

| 6,424,051 B1 * | 7/2002 | Shinogi ............... H01L 23/3185 257/758 |
| 6,589,711 B1 * | 7/2003 | Subramanian .... H01L 21/76808 257/E21.579 |
| 6,977,205 B2 | 12/2005 | Komatsubara |
| 7,619,266 B2 | 11/2009 | Mouli |
| 7,855,105 B1 * | 12/2010 | Jagannathan ..... H01L 21/82343 257/E21.629 |

(Continued)

OTHER PUBLICATIONS

Kim et al., "Investigation of Fixed Oxide Charge and Fin Profile Effects on Bulk FinFET Device Characteristics," IEEE Electron Device Letters, vol. 34, No. 12. Dec. 2013.

*Primary Examiner* — Dale E Page
*Assistant Examiner* — Quovaunda V Jefferson
(74) *Attorney, Agent, or Firm* — Matthew C. Zehrer

(57) ABSTRACT

A semiconductor structure includes a layered dipole structure formed upon a fin sidewall within a fin trench. The layered dipole structure includes a dipole layer of opposite polarity relative to the polarity of the fin and reduces source to drain leakage. A semiconductor structure may include a first layered dipole structure formed within a gate trench within a first polarity region of the semiconductor structure. A second layered dipole structure is formed within a gate trench within a second polarity region of the semiconductor structure and formed upon the first layered dipole structure. The layered dipole structure nearest to the bottom of the gate trench includes a dipole layer of opposite polarity relative to the polarity region of the semiconductor structure where the gate trench is located and reduces source to drain leakage.

5 Claims, 13 Drawing Sheets

(56) References Cited

U.S. PATENT DOCUMENTS

| | | | |
|---|---|---|---|
| 8,173,499 B2 * | 5/2012 | Chung | H01L 21/82382 257/316 |
| 2008/0290397 A1 | 11/2008 | Hsu et al. | |
| 2014/0054662 A1 | 2/2014 | Yanagita et al. | |

* cited by examiner

US 9,799,654 B2

FET TRENCH DIPOLE FORMATION

FIELD

Embodiments of invention generally relate to semiconductor devices, design structures for designing a semiconductor device, and semiconductor device fabrication methods. More particularly, embodiments relate to a field effect transistor (FET) including a dipole formed upon a trench sidewall.

BACKGROUND

A FET includes a source/drain region formed in or upon a wafer and a gate covering a channel region formed in or upon the wafer. A FET may be an nFET or a pFET and may be formed utilizing CMOS (Complementary metal-oxide-semiconductor) fabrication techniques.

The term FinFET typically refers to a nonplanar, double-gate transistor. Integrated circuits that include FinFETs may be fabricated on a bulk silicon substrate or, more commonly, on a silicon-on-insulator (SOI) wafer that includes an active SOI layer of a single crystal semiconductor, such as silicon, a semiconductor substrate, and a buried insulator layer, e.g., a buried oxide layer that separates and electrically isolates the semiconductor substrate from the SOI layer. Each FinFET generally includes a narrow vertical fin body of single crystal semiconductor material with vertically-projecting sidewalls. A gate contact or electrode intersects a channel region of the fin body and is isolated electrically from the fin body by a thin gate dielectric layer. At opposite ends of the fin body are heavily-doped source/drain regions.

FET fabrication techniques form various trenches. For example, in FinFET fabrication, numerous fins may be formed by etching or otherwise removing portions of one or more layer(s). The portions of the one or more layer(s) that are retained form the fins and the space between the fins is referred to as a fin trench. Similarly, in gate-last CMOS fabrication, a dummy gate is removed between opposing gate spacers and is replaced by a conductive replacement gate. The space between the opposing spacers subsequent to the removal of the dummy gate is referred to as a gate trench.

SUMMARY

In a first embodiment of the present invention, a semiconductor device fabrication method includes forming a negative polarity fin within an nFET region and a positive polarity fin within a pFET region, forming a fin-trench between the negative polarity fin and the positive polarity fin, forming a first dipole structure upon a sidewall of the negative polarity fin facing the fin-trench, the first dipole structure comprising a first oxide layer upon the negative polarity fin sidewall and a positive polarity dipole layer upon the first oxide layer, and forming a second dipole structure upon a sidewall of the positive polarity fin facing the fin-trench, the second dipole structure comprising a second oxide layer upon the positive polarity fin sidewall and a negative polarity dipole layer upon the second oxide layer.

In another embodiment of the present invention, a semiconductor device fabrication method includes forming a first dummy gate upon a negative polarity semiconductor substrate region and forming a second dummy gate within a positive polarity semiconductor substrate region, forming opposing facing spacers upon the first dummy gate sidewalls and upon the second dummy gate sidewalls, respectively, removing the first dummy gate between the opposing facing spacers forming a first gate trench, removing the second dummy gate between the opposing facing spacers forming a second gate trench, enlarging the first gate trench and the second gate trench by partially recessing the semiconductor substrate within the first gate trench and within the second gate trench, respectively, forming a first dipole structure within the first gate trench, the first dipole structure comprising a first oxide layer upon semiconductor substrate first gate trench facing surfaces and a positive polarity dipole layer upon the first oxide layer, and, forming a second dipole structure within the second gate trench, the second dipole structure comprising a second oxide layer upon semiconductor substrate second gate trench facing surfaces and a positive polarity dipole layer upon the first oxide layer.

In yet another embodiment of the present invention, a semiconductor device includes a negative polarity fin within an nFET region of the semiconductor device and a positive polarity fin within a pFET region of the semiconductor device, a fin-trench between the negative polarity fin and the positive polarity fin, a first dipole structure upon a sidewall of the negative polarity fin facing the fin-trench, the first dipole structure comprising a first oxide layer upon the negative polarity fin sidewall and a positive polarity dipole layer upon the first oxide layer, and a second dipole structure upon a sidewall of the positive polarity fin facing the fin-trench, the second dipole structure comprising a second oxide layer upon the positive polarity fin sidewall and a negative polarity dipole layer upon the second oxide layer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Referring now to the FIGS., exemplary process steps of forming a semiconductor structure in accordance with embodiments of the present invention are shown, and will now be described in greater detail below. It should be noted that some of the FIGS. depict a cross section view of the semiconductor structure. Furthermore, it should be noted that while this description may refer to some components of a semiconductor structure in the singular tense, more than one component may be depicted throughout the figures and like components are labeled with like numerals. The specific number of components depicted in the figures and the cross section view was chosen for illustrative purposes only.

Some embodiments relate to semiconductor structure, such as a FinFETs, including a layered dipole structure formed upon a fin sidewall within a fin trench. The layered dipole structure includes a dipole layer of opposite polarity relative to the polarity of the fin and may reduce source to drain leakage.

Figure 1:
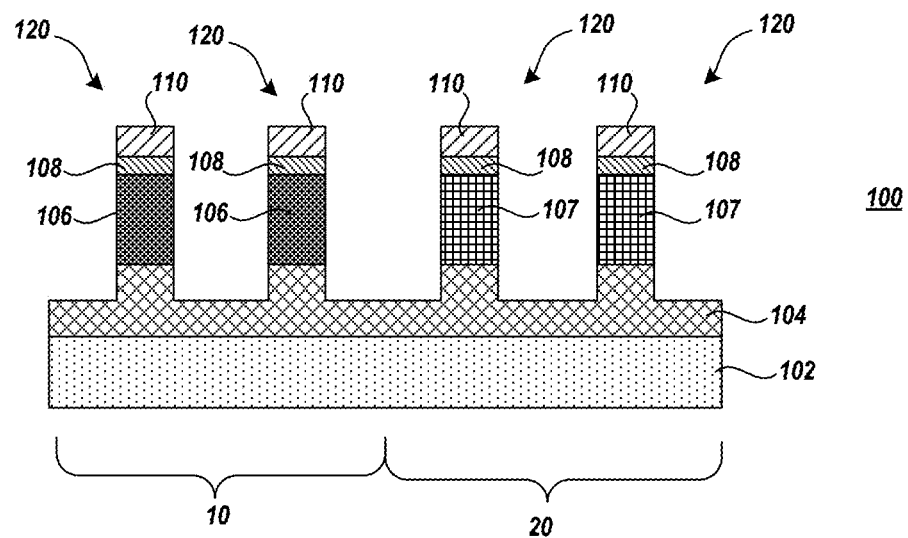
FIG. 1-FIG. 11 depict cross section views of an exemplary semiconductor structure at intermediate stages of semiconductor device fabrication, in accordance with various embodiments of the present invention.

FIG. 1 depicts a fin 120 cross section view of an exemplary semiconductor structure 100 at an intermediate stage of semiconductor device fabrication, in accordance with various embodiments of the present invention. At the present initial stage of fabrication, semiconductor structure 100 includes an nFET region 10, a pFET region 20, a foundational layer 102, a recessed dielectric layer 104, and fins 120. At the present stage of fabrication fins 120 within nFET region 10 include n-fin material 106 upon the recessed dielectric layer 104, oxide 108 upon the n-fin material 106, and cap 110 upon the oxide 108. Likewise, at the present stage of fabrication fins 120 within pFET region 20 include p-fin material 107 upon the recessed dielectric layer 104, oxide 108 upon the p-fin material 107, and cap 110 upon the oxide 108.

Foundational layer 102 may be a wafer, semiconductor substrate, or an epitaxially grown layer, or the like. For example, foundational layer 102 may be bulk silicon. Typically foundational layer 102 may be about, but is not limited to, several hundred microns thick. For example, the foundational layer 102 may have a thickness ranging from 200 nm to about 5 um.

A dielectric layer may be formed upon the foundation layer 102 by epitaxially growing material (e.g. SiGe—25% atomic weight Ge, and the like) from the underlying foundational layer 102. Generally, epitaxial growth, grown, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Examples of various epitaxial growth process apparatuses that are suitable for use in forming epitaxial material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects.

The dielectric layer may have a thickness ranging from 0 nm to about 1 um. For clarity, the dielectric layer may be partially recessed during fin 120 formation, as described below. The partially recessed dielectric layer is herein referred to as recessed dielectric layer 104.

Fins 120 within nFET region 10 may be formed by depositing a n-type material (e.g., silicon, and the like) layer upon the dielectric layer, implanting the n-type material layer with n-type dopants, depositing an oxide layer upon the n-type material layer, and depositing a cap layer upon the oxide layer. The n-type material layer may have a thickness ranging from 10 nm to 100 nm. The oxide layer may have a thickness ranging from 1 nm to about 10 nm. The cap layer may be SiN or the like and may have a thickness ranging from 5 nm to about 100 nm.

A subtractive etching technique, such as reactive ion etching (RIE), removes portions of the cap layer, portions of the oxide layer, portions of the n-type material layer, and portions of the dielectric layer. The removal of the various materials by the substantive etching technique generally forms fin trenches within the nFET region 10. The subtractive etching technique can be formed by a directional dry etch which can form substantially straight fin 120 sidewalls or by a wet (or other isotropic) etch process which can form angled fin 120 sidewalls, undercuts, etc. For example, the fins 120 within nFET region 10 may be generally rectangular shaped, as shown, or may be generally triangularly shaped, or the like. Certain subtractive etching techniques include lithography practices well known to those skilled in the art including: providing the cap layer, patterning the cap layer, and etching the patterned cap layer and underlying materials. As is known in the art, etchants utilized in substantive etching techniques generally remove materials. One or more known etchants may be utilized to remove the portions of the cap layer, portions of the oxide layer, portions of the n-type material layer, and portions of the dielectric layer. Exposure to the one or more etchants may be timed to fully remove the cap layer, the oxide layer, and the n-type material layer within the pattern and remove merely a portion of the dielectric layer. The materials remaining adjacent to the fin trench generally form fins 120 within nFET region 10. For example, following formation of the fin trench, fins 120 within nFET region 10 include n-fin material 106 upon the recessed dielectric layer 104, oxide 108 upon the n-fin material 106, and cap 110 upon the oxide 108. The fin trench may be generally "U" shaped, "V" shaped, etc.

Fins 120 within pFET region 20 may be similarly formed by depositing a p-type material (SiGe—50% atomic weight Ge, and the like) layer upon the dielectric layer, implanting the p-type material layer with p-type dopants, depositing an oxide layer upon the p-type material layer, and depositing a cap layer upon the oxide layer. The p-type material layer may have the same thickness as the n-type material layer. A subtractive etching technique, such as reactive ion etching (RIE), removes portions of the cap layer, portions of the oxide layer, portions of the p-type material layer, and portions of the dielectric layer. The removal of the various materials by the substantive etching technique generally forms fin trenches within pFET region 20. The substantive etching technique forming fins 120 in pFET region 20 and forming fins 120 in pFET region 20 may be a single stage wherein fins 120 in pFET region 20 and fins 120 are simultaneously formed, or be multiple stages wherein fins 120 in pFET region 20 are formed prior to fins 120 in pFET region 20, or visa versa.

The fins 120 within pFET region 20 may be generally rectangular shaped, as shown, or may be generally triangularly shaped, or the like. Certain subtractive etching techniques include lithography practices well known to those skilled in the art including: providing the cap layer, patterning the cap layer, and etching the patterned cap layer and underlying materials. One or more known etchants may be utilized to remove the portions of the cap layer, portions of the oxide layer, portions of the p-type material layer, and portions of the dielectric layer. Exposure to the one or more etchants may be timed to fully remove the cap layer, the oxide layer, and the p-type material layer within the pattern and remove merely a portion of the dielectric layer. The materials remaining adjacent to the fin trench generally form fins 120 within pFET region 20. For example, following formation of the fin trench, fins 120 within pFET region 20 include n-fin material 106 upon the recessed dielectric layer 104, oxide 108 upon the n-fin material 106, and cap 110 upon the oxide 108.

Figure 2:
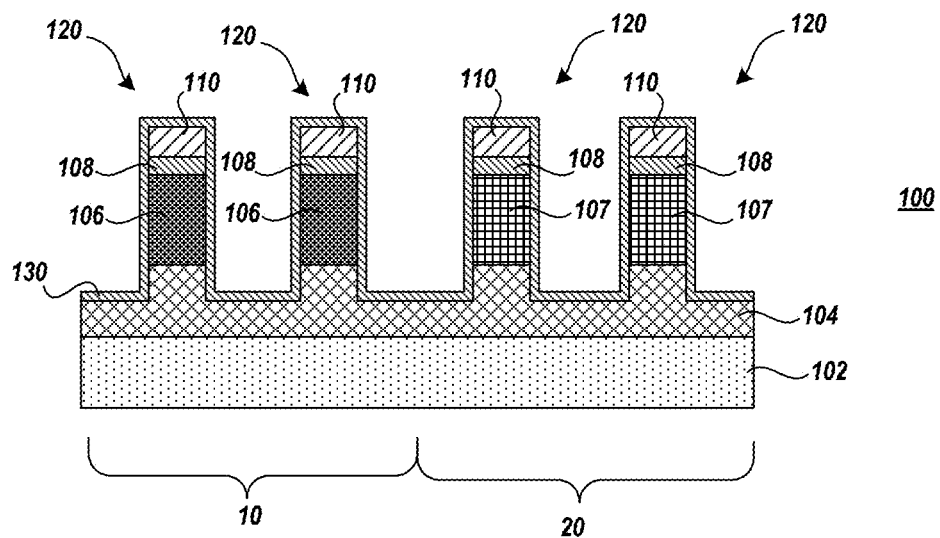

FIG. 2 depicts a fin 120 cross section view of semiconductor structure 100 at an intermediate stage of semiconductor device fabrication, in accordance with various embodiments of the present invention. At the present stage of fabrication, an oxide layer 130 is formed at least upon the sidewalls of n-fin material 106 and p-fin material 107.

In embodiments, the oxide layer 130 may be formed by native oxidation of the sidewall surfaces of the n-fin material 106 and p-fin material 107 when exposed to air. When oxide layer 130 is a native oxidation layer, the oxide layer 130 may have a thickness about 0.3 nm to about 5 nm.

In other embodiments, as are herein depicted, the oxide layer 130 may be formed by depositing silicon oxide upon the recessed dielectric layer 104 and upon the fins 120. For example, in nFET region 10, the oxide layer 130 may be deposited upon the upper surface and sidewall surfaces of recessed dielectric layer 104, the sidewall surfaces of the n-fin material 106, the side surfaces of oxide layer 180, and the sidewall surfaces and upper surfaces of cap 110. The oxide layer 130 may be formed by thin-film deposition methods, such as chemical vapor deposition, atomic layer deposition, and the like. When oxide layer 130 is a deposited oxide layer, the oxide layer 130 may have a thickness about 0.3 nm to about 5 nm. In embodiments, the thickness of oxide layer 130 is minimized.

Figure 3:
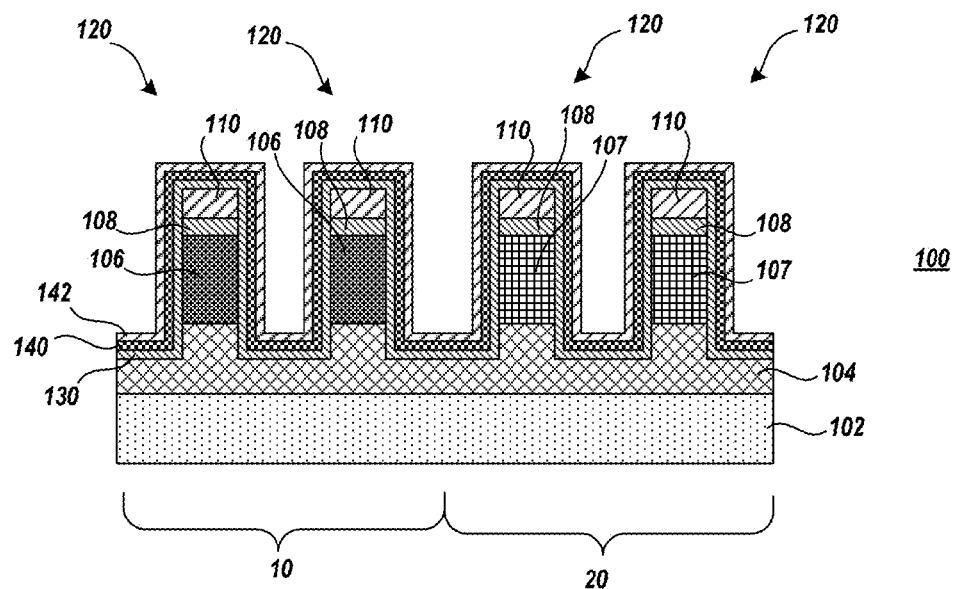

FIG. 3 depicts a fin 120 cross section view of semiconductor structure 100 at an intermediate stage of semiconductor device fabrication, in accordance with various embodiments of the present invention. At the present stage of fabrication, a positive polarity dipole layer 140 is formed upon the oxide layer 130 and a liner layer 142 is formed upon the positive polarity dipole layer 140.

Negative polarity dipole layer 140 is formed by depositing a material inherently including a negative polarity. Such materials may include $Al_2O_3$, $TiO_2$, $ZrO_2$, $HfO_2$, MgO, or the like. A dipole is formed by the oxide layer 130 separating the negative polarity dipole layer 140 from the p-fin material 106. The negative polarity dipole layer 140 upon the p-type material 106 sidewalls reduces source to drain leakage current within nFET region 10.

If the oxide layer 130 is a native oxide layer local to the n-type fin material 106, the positive polarity dipole layer 140 may be formed by depositing the positive polarity material upon the recessed dielectric layer 104 and upon the fins 120. For example, in nFET region 10, the positive polarity dipole layer 140 may be deposited upon the upper surface and sidewall surfaces of recessed dielectric layer 104, the native oxide layer 130 surfaces of the n-fin material 106, the side surfaces of oxide layer 180, and the sidewall surfaces and upper surfaces of cap 110. If the oxide layer 130 is a deposited layer, the positive polarity dipole layer 140 may be formed upon the upper and sidewall surfaces of the deposited oxide layer 130.

The positive polarity dipole layer 140 may be formed by thin-film deposition methods, such as chemical vapor deposition, atomic layer deposition, and the like. The positive polarity dipole layer 140 may have a thickness about 0.1 nm to about 3 nm.

Liner layer 142 is formed by depositing a dielectric material, such as SiN, TaN, and TiN upon the positive polarity dipole layer 140. Liner layer 142 is capping layer which protects dipole layer 140 from oxidation or other similar reactions from following process. The liner layer 142 may be formed by thin-film deposition methods, such as chemical vapor deposition, atomic layer deposition, and the like. The liner layer 142 may have a thickness about 1 nm to about 10 nm.

Figure 4:
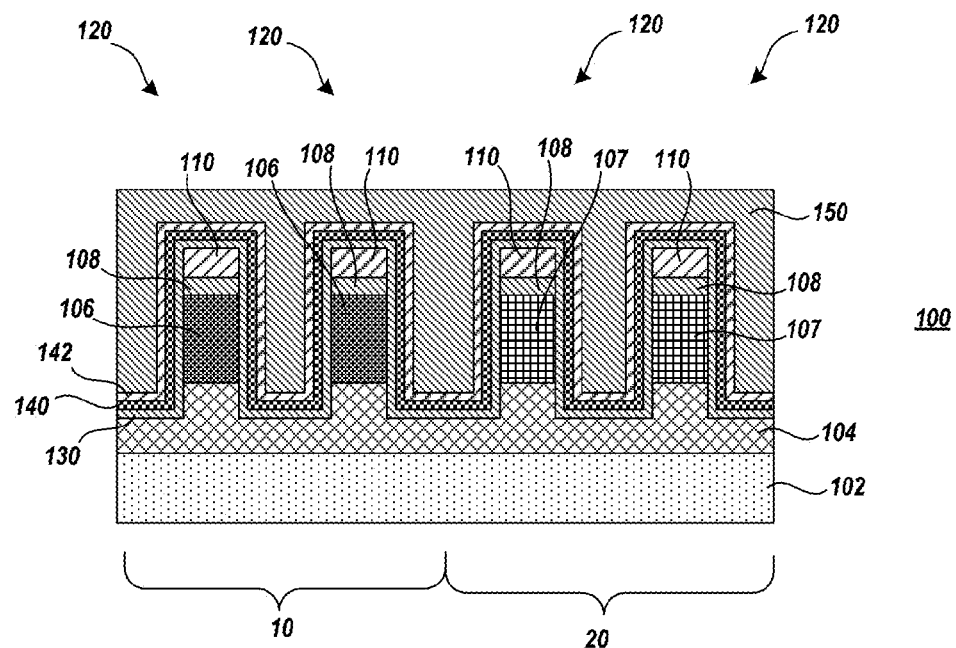

FIG. 4 depicts a fin 120 cross section view of semiconductor structure 100 at an intermediate stage of semiconductor device fabrication, in accordance with various embodiments of the present invention. At the present stage of fabrication, a blanket dielectric material 150 is formed upon the liner layer 142. The blanket dielectric material 150 may be formed by depositing a dielectric material, such as silicon oxide, upon the liner layer 142 and within the remaining fin trenches. The blanket dielectric material 150 may be formed by CVD, spin coating, or the like. The blanket dielectric material 150 generally protects a region of structure 100 while further processing may occur the other region of structure 100. For example, blanket dielectric material 150 generally protects nFET region 10 while further processing may occur pFET region 20.

Figure 5:
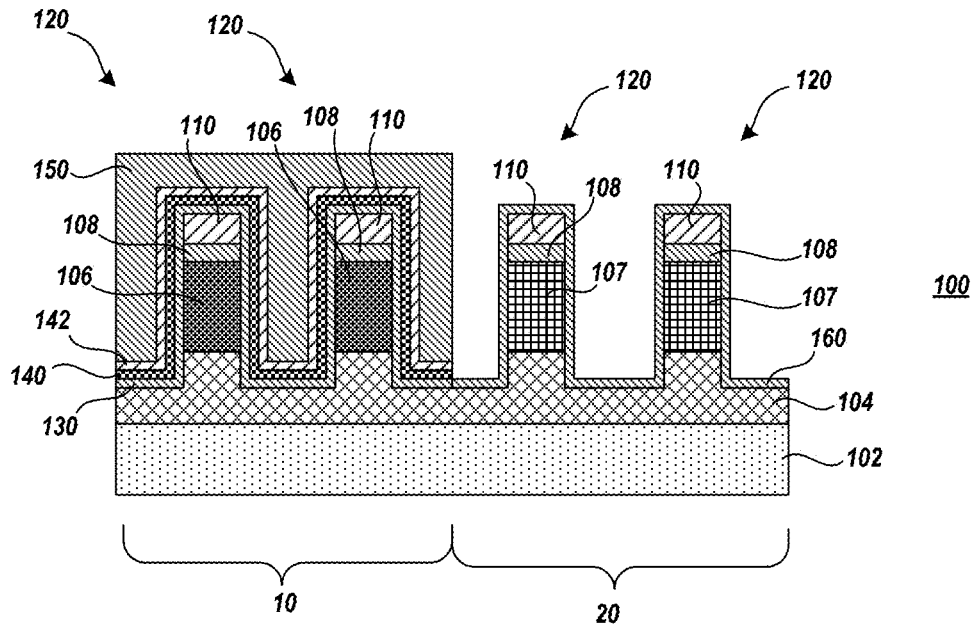

FIG. 5 depicts a fin 120 cross section view of semiconductor structure 100 at an intermediate stage of semiconductor device fabrication, in accordance with various embodiments of the present invention. At the present stage of fabrication, at least the blanket dielectric material 150, liner layer 142, and the positive polarity dipole layer 140 are removed within the pFET region 20.

A subtractive etching technique, such as reactive ion etching (RIE), may remove blanket dielectric material 150, liner layer 142, and the positive polarity dipole layer 140. This particular etching technique may utilize the oxide layer 130 within pFET region 20 as an etch stop layer, retaining the oxide layer 130 within pFET region 20 (not shown). Such etching technique may include multiple stages where an etchant removes the dielectric material 150 and another etchant removes liner layer 142 and the positive polarity dipole layer 140 utilizing the oxide layer 130 as a etch stop. Other etching techniques may remove blanket dielectric material 150, liner layer 142, the positive polarity dipole layer 140, and the oxide layer 130 within pFET region 20 exposing at least the sidewall surfaces of p-fin material 107.

The subtractive etching technique can be formed by a directional dry etch which can form substantially straight sidewalls. A particular subtractive etching technique utilizes lithography practices well known to those skilled in the art including: providing a mask layer upon the dielectric material 150, patterning the mask layer, and etching the patterned mask layer and underlying materials. As is known in the art, etchants utilized in substantive etching techniques generally remove materials. One or more known etchants may be utilized to remove the portions of the mask layer within pFET region 20, the dielectric material 150 within pFET region 20, the liner layer 142 within pFET region 20, the positive polarity dipole layer 140 within pFET region 20, and the oxide layer 130 within pFET region 20. In other words, the fins 120 within pFET region 20 may be exposed.

If the oxide layer 130 is removed, an oxide layer 160 may be formed upon at least the exposed sidewalls of the p-fin material 107. The oxide layer 160 may be formed by native oxidation of the sidewall surfaces of the p-fin material 107 when exposed to air. In other embodiments, if the oxide layer 130 is removed, an oxide layer 160 may be formed by depositing silicon oxide upon the exposed recessed dielectric layer 104 and upon the fins 120 within pFET region 20. For example, the oxide layer 160 may be deposited upon the upper surface and sidewall surfaces of recessed dielectric layer 104 in pFET region 20, the sidewall surfaces of the p-fin material 107, the side surfaces of oxide layer 180 in pFET region 20, and the sidewall surfaces and upper surfaces of cap 110 in pFET region 20. The oxide layer 160 may be formed by thin-film deposition methods, such as chemical vapor deposition, atomic layer deposition, and the like. Oxide layer 160 may be the same thickness as oxide layer 130.

Figure 6:
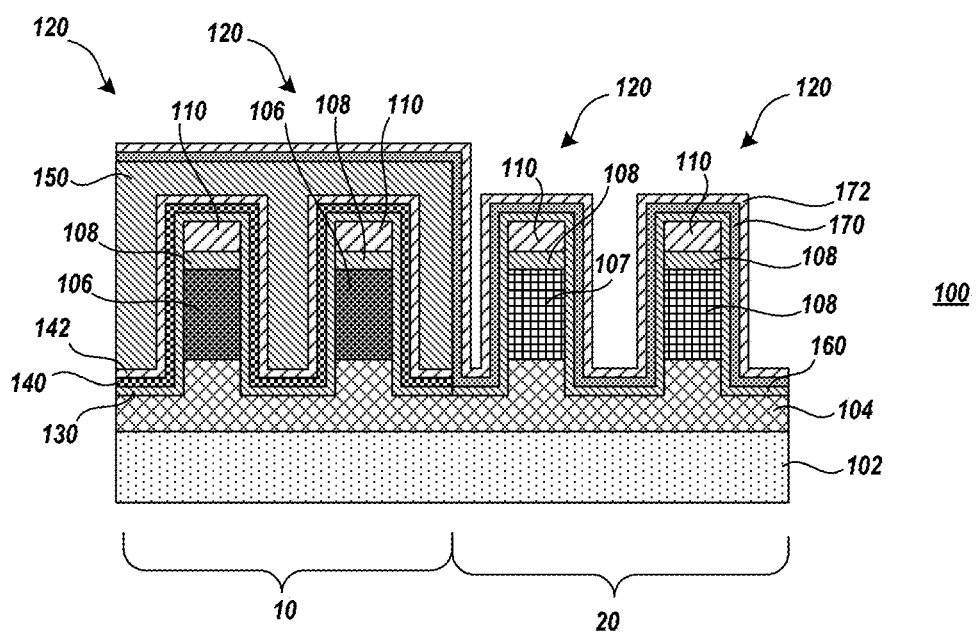

FIG. 6 depicts a fin 120 cross section view of semiconductor structure 100 at an intermediate stage of semiconductor device fabrication, in accordance with various embodiments of the present invention. At the present stage of fabrication, a negative polarity dipole layer 170 is formed upon the pFET region 20 oxide layer and a liner layer 172 is formed upon the negative polarity dipole layer 170. For clarity, if the oxide layer 130 is retained, the negative polarity dipole layer 170 is formed upon the oxide layer 130 and if the oxide layer 130 is removed and oxide layer 160 is formed, the negative polarity dipole layer 170 is formed upon the oxide layer 160.

Positive polarity dipole layer 170 is formed by depositing a material inherently including a positive polarity. Such materials may include $GeO_2$, $Y_2O_3$, $Lu_2O_3$, $La_2O_3$, SrO, or the like. A dipole is formed by the oxide layer separating the positive polarity dipole layer 170 from the n-fin material 107. The positive polarity dipole layer 170 upon the n-type material 107 sidewalls reduces source to drain leakage current within pFET region 20.

If oxide layer 130 is stripped and if the oxide layer 160 is a native oxide layer local to the p-type fin material 107, the negative polarity dipole layer 170 may be formed by depositing the negative polarity material upon the recessed dielectric layer 104, upon the fins 120, and upon dielectric material 150. For example, the negative polarity dipole layer 170 may be deposited upon the exposed upper surface and sidewall surfaces of recessed dielectric layer 104, the native oxide layer 160 surfaces of the p-fin material 107, the exposed side surfaces of oxide layer 180, the exposed sidewall surfaces and upper surfaces of cap 110, and upon the dielectric material 150 side surface and upper surface. If oxide layer 130 is removed and if the oxide layer 160 is a deposited layer, the negative polarity dipole layer 170 may be formed upon the exposed upper and sidewall surfaces of the deposited oxide layer 160 and upon the dielectric material 150 side surface and upper surface.

The negative polarity dipole layer 170 may be formed by thin-film deposition methods, such as chemical vapor deposition, atomic layer deposition, and the like. The negative polarity dipole layer 170 may have the same thickness as the positive polarity dipole layer 140.

Liner layer 172 is formed by depositing a dielectric material, such as SiN, TaN, and TiN upon the negative polarity dipole layer 170. Liner layer 172 is capping layer which protect layer 170 from oxidation or reaction from following process. The liner layer 172 may be formed by thin-film deposition methods, such as chemical vapor deposition, atomic layer deposition, and the like. The liner layer 172 may have be the same thickness as liner layer 142.

Figure 7:
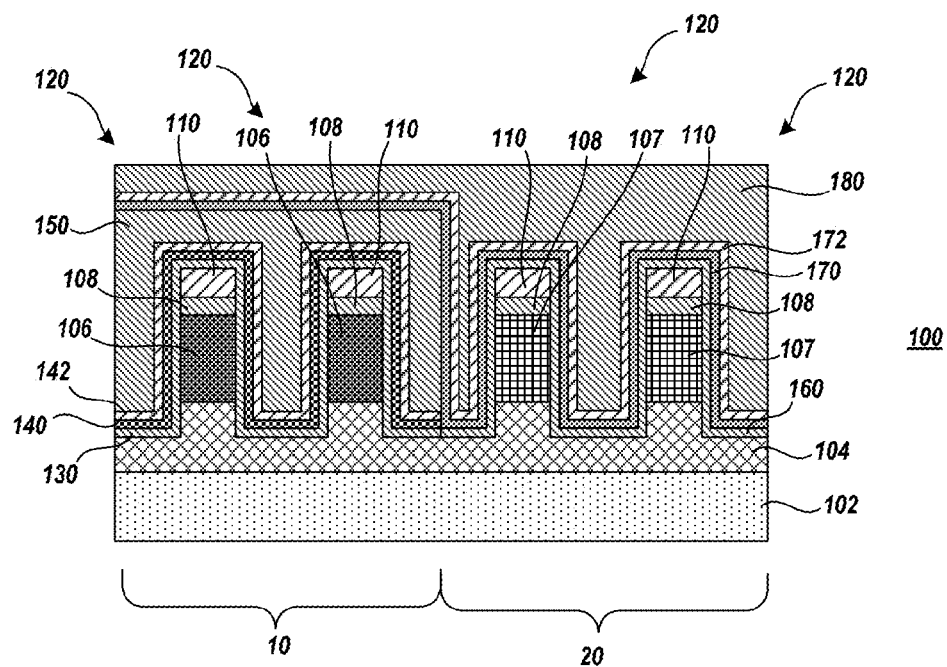

FIG. 7 depicts a fin 120 cross section view of semiconductor structure 100 at an intermediate stage of semiconductor device fabrication, in accordance with various embodiments of the present invention. At the present stage of fabrication, a blanket dielectric material 180 is formed upon the liner layer 172. The blanket dielectric material 180 may be formed by depositing a dielectric material, such as silicon oxide, upon the liner layer 172 in the nFET region 10 and the pFET region 20 and within the remaining fin trenches within pFET region 20. The blanket dielectric material 180 may be formed by CVD, spin coating, or the like.

Figure 8:
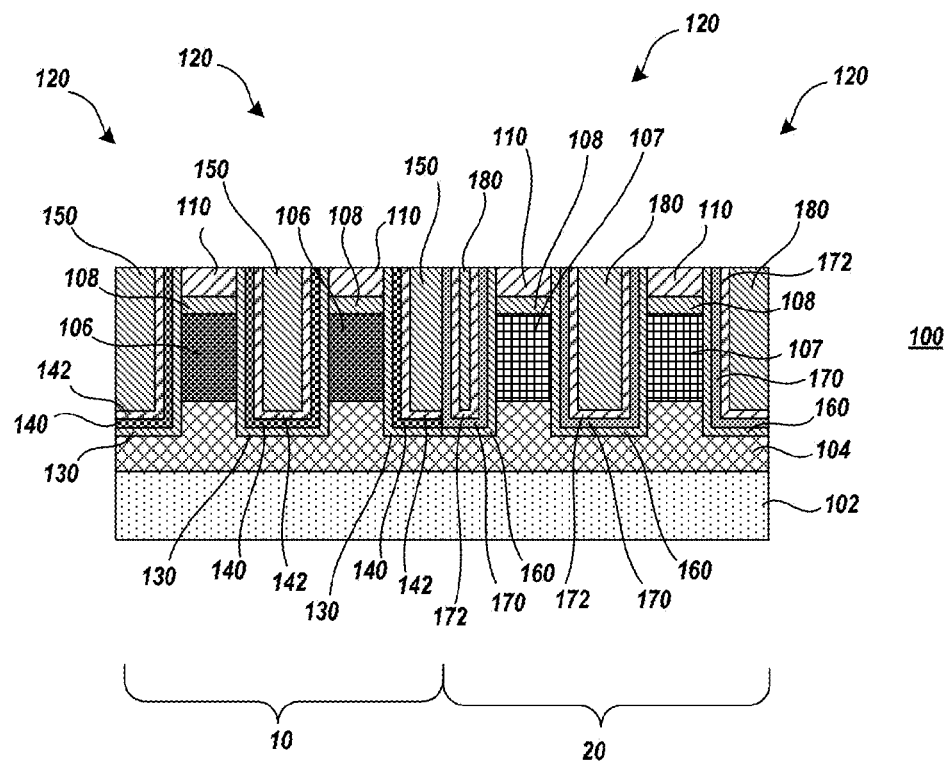
Figure 9:
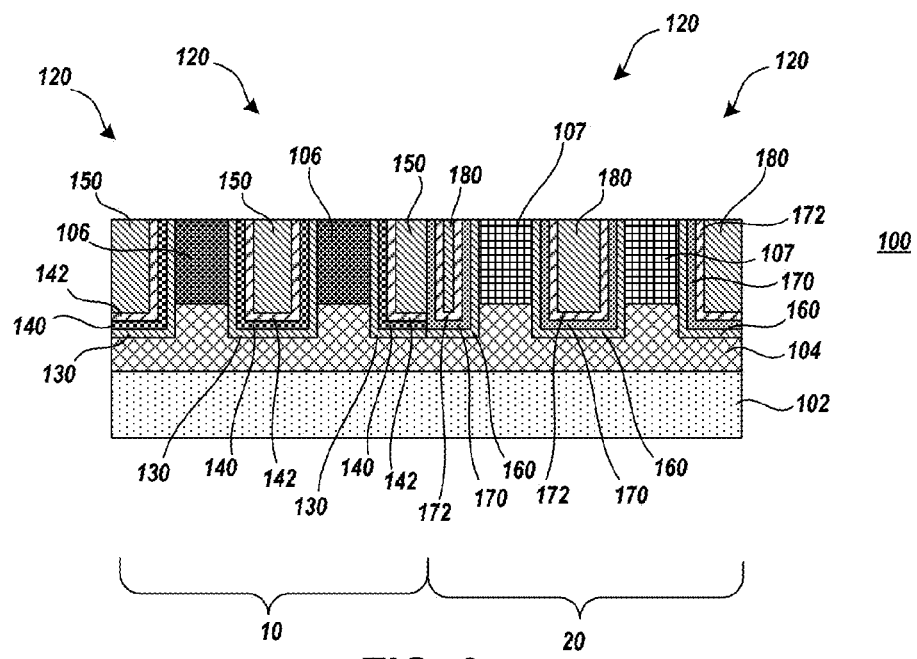

FIG. 8 and FIG. 9 depict fin 120 cross section views of semiconductor structure 100 at an intermediate stage of semiconductor device fabrication, in accordance with various embodiments of the present invention. At the present stages of fabrication, overburden material is removed. More specifically, overburden dielectric material 180, overburden liner layer 172, overburden negative polarity dipole layer 170, overburden dielectric material 150, overburden liner layer 142, overburden positive polarity dipole layer 140, overburden oxide layer 130, overburden oxide layer 160, overburden cap 110, and overburden dielectric layer 108 may be removed generally above the plane of the n-fin material 106 and p-fin material 107. The removal of the overburden above the plane of the n-fin material 106 and p-fin material 107 may result in a planarized structure, as shown in FIG. 9. The overburden may be removed by subtractive etching technique, such as RIE, and/or a chemical mechanical polish (CMP). The removal of the overburden material may include multiple stages. For example, as shown in FIG. 8, overburden materials generally above the plane of the upper surface of cap 110 may be initially removed and as shown in FIG. 9, overburden material generally above the plane of the upper surface of n-fin material 106 and p-fin material 107 may be further removed. The various stages of overburden removal may utilize different removal techniques. For example, overburden above the plane of the upper surface of cap 110 may be removed by CMP and further remaining overburden above the plane of the upper surfaces of n-fin material 106 and p-fin material 107 may be removed by subtractive etching.

Figure 10:
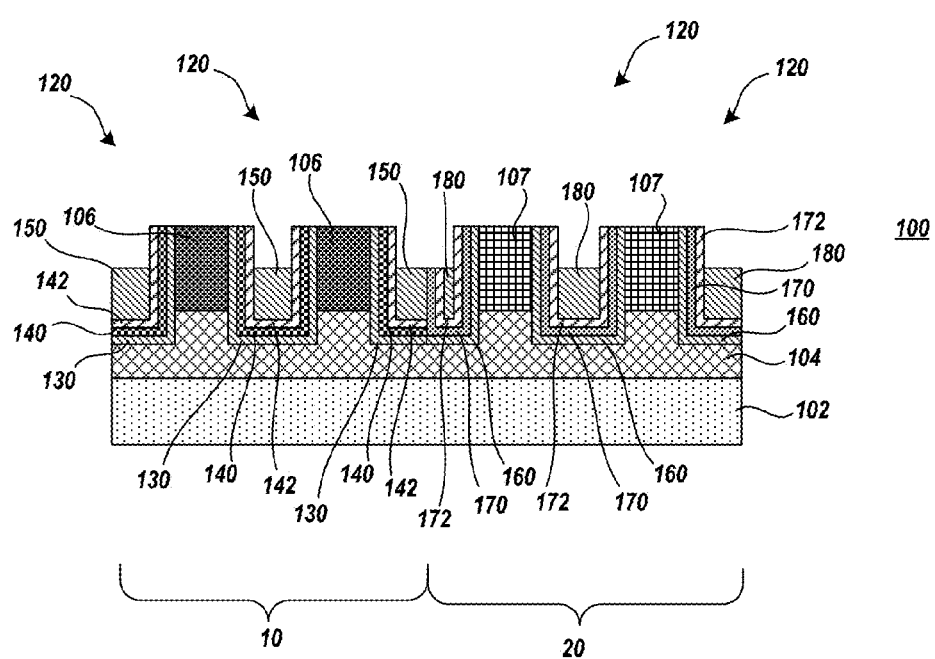

FIG. 10 depicts a fin 120 cross section view of semiconductor structure 100 at an intermediate stage of semiconductor device fabrication, in accordance with various embodiments of the present invention. At the present stage of fabrication, material within the fin trenches between the vertical liner layer portions generally parallel with the sidewalls fins 120 is partially recessed.

Within the n-FET region 10, dielectric material 150 may be partially recessed within the fin trench between the liner layer 142 generally parallel with the sidewalls fins 120. Within the p-FET region 20, dielectric material 180 may be partially recessed within the fin trench between the liner layer 172 generally parallel with the sidewalls fins 120. Within the fin trench that separates the n-FET region 10 and the p-FET region 20, dielectric material 150, dielectric material 180, negative polarity dipole layer 170, and liner layer 172 are partially recessed generally between the liner layer 172 generally parallel with the sidewalls fins 120.

The depth of this recessing within the fin trenches may be similar such that the upper surfaces of the material(s) within the fin trench between the respective vertical liner layer portions are coplanar. In an embodiment, the material of the liner layer and the material(s) within the fin trench between the liner layer are chosen to provide for selective etching such that the material(s) within the fin trench between the liner layer are removed and the liner layer is retained.

The material(s) within the fin trench between the vertical liner layer portions may be removed by subtractive etching techniques. Certain subtractive etching techniques include lithography practices well known to those skilled in the art including: providing a mask layer upon the upper planar surface of the structure 100 as shown in FIG. 9, patterning the mask layer, and etching the patterned mask layer and partially etching the underlying materials. Exposure to the one or more etchants may be timed to fully remove the mask layer, partially removes the dielectric material 150, partially removes the dielectric material 180, partially removes the negative polarity dipole layer 170, and partially removes the liner layer 172. The dielectric material 150 that remains in fin trenches subsequent to the partial recessing of the present stage of fabrication is herein referred to as dielectric material 150'. The dielectric material 180 that remains in fin trenches subsequent to the partial recessing of the present stage of fabrication is herein referred to as dielectric material 180'.

Figure 11:
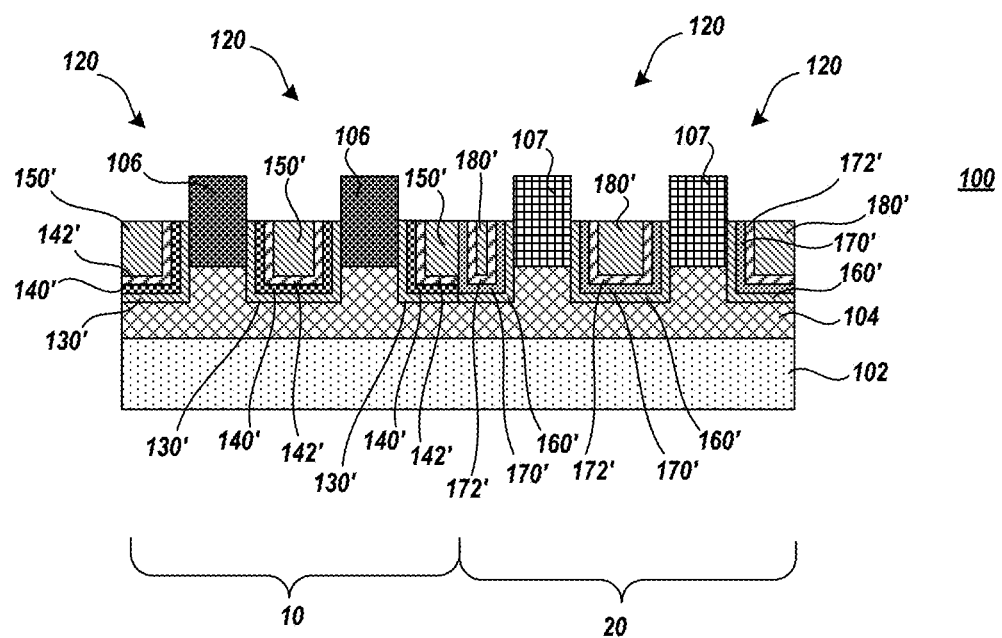

FIG. 11 depicts a fin 120 cross section view of semiconductor structure 100 at an intermediate stage of semiconductor device fabrication, in accordance with various embodiments of the present invention. At the present stage of fabrication, material within the fin trenches between fins 120 are partially recessed.

Within the n-FET region 10, the vertical oxide layer 130 portion upon the sidewall of the n-fin material 106, the vertical positive polarity dipole layer 140 portion upon the vertical oxide layer 130, and the vertical liner layer 142 upon the vertical positive polarity dipole layer 140 are partially recessed to be coplanar with the upper surface of the dielectric material 150'. Within the p-FET region 20, the vertical oxide layer 130/160 portion upon the sidewall of the p-fin material 107, the vertical negative polarity dipole layer 170 portion upon the vertical oxide layer 130/160, and the vertical liner layer 172 upon the vertical negative polarity dipole layer 170 are partially recessed to be coplanar with the upper surface of the dielectric material 180'.

Within the fin trench that separates the n-FET region 10 and the p-FET region 20, the vertical oxide layer 130 portion upon the sidewall of the n-fin material 106, the vertical positive polarity dipole layer 140 portion upon the vertical oxide layer 130 are partially recessed to be coplanar with the upper surface of the dielectric material 150' and the vertical liner layer 142 upon the vertical positive polarity dipole layer 140, the vertical oxide layer 130/160 portion upon the sidewall of the p-fin material 107, the vertical negative polarity dipole layer 170 portion upon the vertical oxide layer 130/160, the vertical liner layer 172 upon the vertical negative polarity dipole layer 170 are partially recessed to be coplanar with the upper surface of dielectric material 180'.

The material within the fin trenches between fins 120 may be partially recessed by subtractive etching techniques. Certain subtractive etching techniques include lithography practices well known to those skilled in the art including: providing a mask layer upon the upper surfaces of n-fin 106 and p-fin 107, patterning the mask layer, and etching the patterned mask layer and partially etching the underlying materials. Exposure to the one or more etchants may be timed to fully remove the mask layer, and partially removes the vertical portion of oxide layer 130 and/or 160, partially removes the vertical portion of positive polarity dipole layer 140, partially removes the vertical portion of vertical liner layer 142, partially removes the vertical portion of negative polarity dipole layer 170, and partially removes the vertical portion of vertical liner layer 182 to be coplanar with the dielectric material 150' or the recessed dielectric material 180', respectively.

Within the n-FET region 10, the oxide layer 130, the positive polarity dipole layer 140, and the vertical liner layer 142 that is retained subsequent to the partial removal of the present stage of the present invention are herein referred to as the oxide layer 130', positive polarity dipole layer 140', and liner layer 142'. Oxide layer 130', positive polarity dipole layer 140', and liner layer 142' may take on a similar shape as the bottom of the associated fin trench. For example, oxide layer 130', positive polarity dipole layer 140', and liner layer 142' may have a general "U" shape, "V" shape, or the like.

Within the p-FET region 20, the oxide layer 130/160, the negative polarity dipole layer 170, and the vertical liner layer 172 that is retained subsequent to the partial removal of the present stage of the present invention are herein referred to as the oxide layer 130'/160', negative dipole layer 170', and liner layer 172'. Oxide layer 130'/160', negative polarity dipole layer 170', and liner layer 172' may take on a similar shape as the bottom of the associated fin trench. For example, oxide layer 130'/160', negative polarity dipole layer 170', and liner layer 172' may have a general "U" shape, "V" shape, or the like.

Within the fin trench separating the n-FET region 10 and the p-FET region 20, oxide layer 130', positive polarity dipole layer 140', and liner layer 142' may take on a similar shape as the bottom of the associated fin trench. For example, oxide layer 130', positive polarity dipole layer 140', and liner layer 142' may have a partial "U" shape, "V" shape, or the like. Within the fin trench separating the n-FET region 10 and the p-FET region 20, oxide layer 130'/160' may have a partial "U" shape, "V" shape, or the like. Within the fin trench separating the n-FET region 10 and the p-FET region 20, negative polarity dipole layer 170' and liner layer 172' may have a partial "U" shape and/or a partial "V" shape, or the like. Within the fin trench separating the n-FET region 10 and the p-FET region of negative polarity dipole layer 170' and a portion of liner layer 172' may be retained between dielectric material 150 and dielectric material 180. The portion of negative polarity dipole layer 170' and a portion of liner layer 172' retained between dielectric material 150 and dielectric material 180 may be generally vertical.

Figure 12:
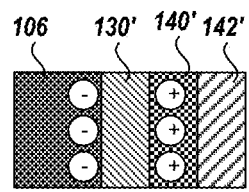
FIG. 12 and FIG. 13 depict a magnified view of dipole formation upon fin trench sidewalls, in accordance with various embodiments of the present invention.
Figure 13:
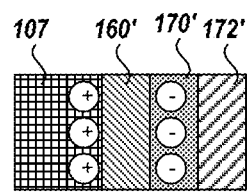

FIG. 12 depicts a magnified view of one or more dipoles formed between n-fin material 106 and positive polarity dipole layer 140'. The dipole is an electric dipole consisting of the separation of positive and negative charges by the oxide layer 130'. FIG. 13 depicts a magnified view of one or more dipoles formed between p-fin material 107 and negative polarity dipole layer 170'. The dipole is an electric dipole consisting of the separation of positive and negative charges by the oxide layer 130'/160'. The dipole pair of electric charges may be of equal magnitude or may be of differing magnitude. The dipole formed may be a permanent electric dipole also referred to as an electret.

Other embodiments relate to gate-last semiconductor structure including a first layered dipole structure formed within a gate trench associated with a gate within a first region. A second layered dipole structure is formed within a gate trench associated with a gate within second region and formed upon the first layered dipole structure. The layered dipole structure nearest to the gate trench includes a dipole layer of opposite polarity relative to the polarity of the associated gate and reduces source to drain leakage.

Figure 14:
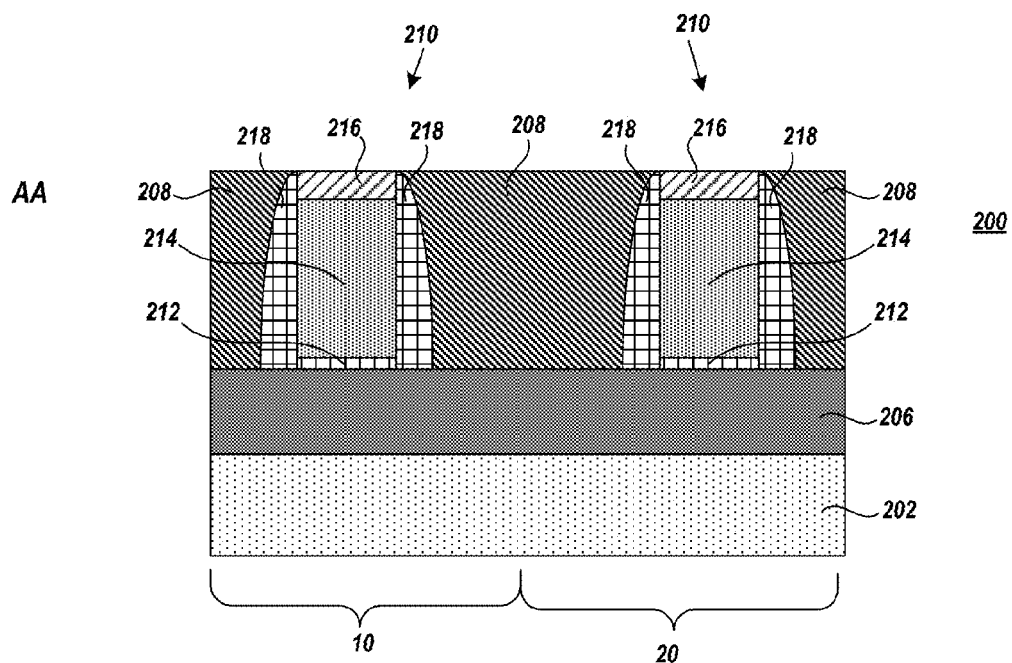
FIG. 14-FIG. 20 depict cross section views of an exemplary semiconductor structure at intermediate stages of semiconductor device fabrication, in accordance with various embodiments of the present invention.

FIG. 14 depicts a gate cross section view of an exemplary semiconductor structure 200 at an intermediate stage of semiconductor device fabrication, in accordance with various embodiments of the present invention. At the present initial stage of fabrication, semiconductor structure 200 includes an nFET region 10, a pFET region 20, a foundational layer 202, a fin 206, sacrificial gate structures 210, and an inter-layer dielectric 208. For clarity, structure 200 is depicted as cross section AA of dummy gate structure 210 along the length of a fin 206.

Foundational layer 202 may be a wafer, semiconductor substrate, or an epitaxially grown layer, or the like. For example, foundational layer 202 may be bulk silicon. Typically foundational layer 202 may be about, but is not limited to, several hundred microns thick. For example, the foundational layer 202 may have a thickness ranging from 200 nm to about 5 um. Foundational layer 202 may include various other layers such as an insulating layer. In these embodiments, foundation layer 202 may be e.g., a silicon-on-insulator substrate. For example, silicon fins 206 may be formed upon the insulator layer of foundational layer 202, as is known in the art.

Fins 206 may be formed by fin formation techniques referred to herein. For example, within n-FET regions 10, fin 206 may be formed from by depositing n-fin material and etching away portions of the n-fin material leaving fin 206 and within p-FET regions 20, fin 206 may be formed from by depositing p-fin material and etching away portions of the p-fin material leaving fin 206. Such fin formation techniques are known in the art.

Technology for forming pFET and nFET devices on finned structures is known and also continues to be developed. The gates of FETs can be formed using a "gate-first" process wherein generally a gate stack and spacers are formed prior to formation of fins 206. A "gate-last" process may alternatively be employed. Gate-last procedures can involve making a dummy gate, fabricating other elements of the transistor, removing the dummy gate, and replacing the removed dummy gate with actual gate materials.

Dummy gate structure 210 may comprise a dummy gate dielectric 212 (e.g., oxide, etc.) formed upon fin 206 and upon foundational layer 202, a dummy gate material 214 (e.g., polysilicon, etc.) on top of the dummy gate dielectric 212, and a dummy gate cap material 216 (e.g., nitride, etc.) on top of the dummy gate material 214. The gate cap material 216 may be a remnant of a masking layer utilizing in the subtractive etching processes utilized to form the gate stack. Dummy gate structure 210 is removed in a later process familiar to those of skill in the art and a replacement gate composition is patterned at an appropriate stage of the transistor fabrication process. Opposing spacers 218 are formed upon the sidewalls of the gate stack and upon the foundation layer 202 adjacent to the fin 206 sidewalls.

Inter-layer dielectric 208 is formed by depositing a blanket dielectric material, such as silicon oxide, to a thickness greater than the height of the dummy gate structure 210. Inter-layer dielectric 208 may be formed by CVD, spin coating, or the like. Overburden inter-layer dielectric material above the plane of the dummy gate cap 216 may be remove by e.g., CMP or the like.

Figure 15:
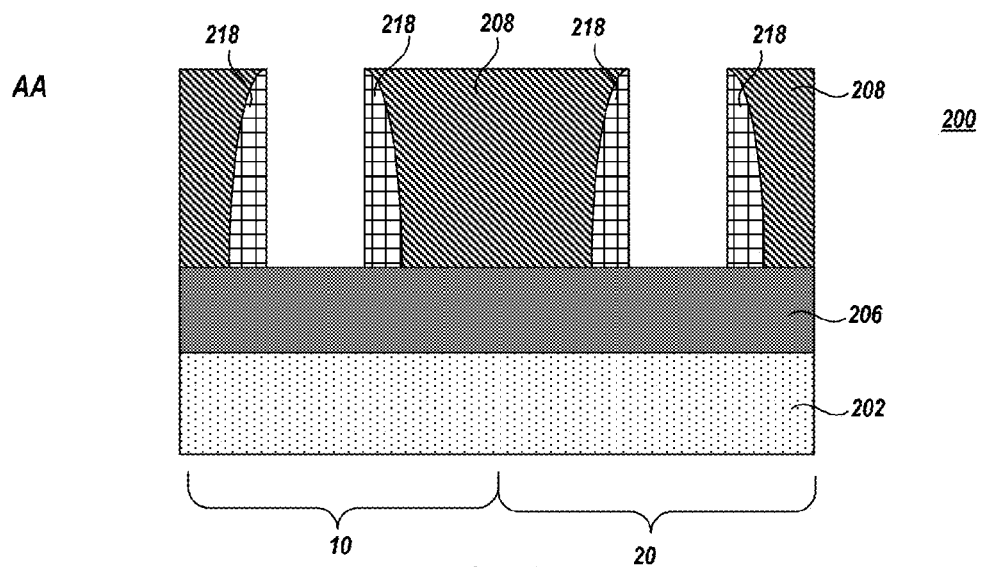

FIG. 15 depicts a gate cross section view of an exemplary semiconductor structure 200 at an intermediate stage of semiconductor device fabrication, in accordance with various embodiments of the present invention. At the present initial stage of fabrication, the dummy gate stack is removed between opposing spacers. For clarity, structure 200 is depicted as cross section AA of dummy gate structure 210 along the length of a fin 206.

A subtractive etching technique, such as RIE, may remove portions of the dummy cap material 216, the dummy gate material 214, and the dummy gate dielectric 212 between opposing spacers 218. The removal of the various materials between the opposing spacers 218 generally forms gate trench. The subtractive etching technique can be formed by a directional dry etch which can form substantially straight gate trench sidewalls or by a wet (or other isotropic) etch process which can form angled gate trench sidewalls. As such the gate trench may be generally "U" shaped, "V" shaped, or the like. Certain subtractive etching techniques include lithography practices well known to those skilled in the art including: providing a mask layer upon the inter-layer dielectric 208 and upon the dummy gate cap 216, patterning the mask layer, and etching the patterned mask layer and underlying materials. The fin material 206 and the foundational layer 202 may be utilized as etch stop surfaces. One or more known etchants may be utilized to remove the dummy cap 216, dummy gate 214, and dummy dielectric 212.

Figure 16:
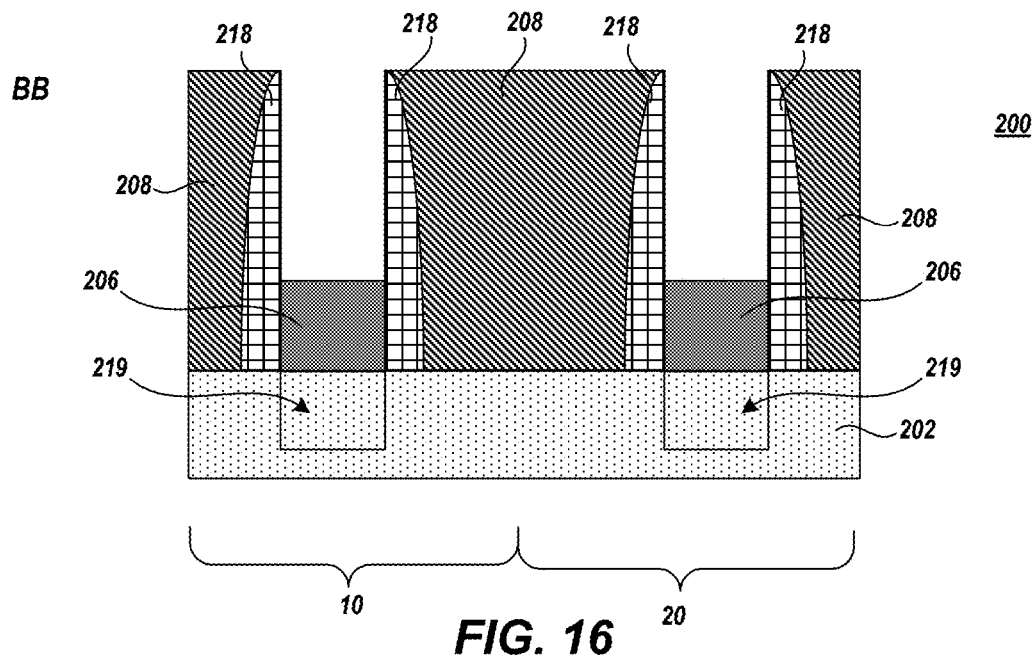

FIG. 16 depicts a gate cross section view of an exemplary semiconductor structure 200 at an intermediate stage of semiconductor device fabrication, in accordance with various embodiments of the present invention. At the present initial stage of fabrication, the gate trench is deepened by partially recessing the foundational layer 202 exposed within the gate trench. For clarity, structure 200 is depicted as cross section BB of dummy gate structure 210 generally between adjacent fins 206.

A subtractive etching technique, such as reactive ion etching RIE, removes portions of portions of the foundational layer 202, thereby deepening the gate trench. The foundational layer 202 material removed within the gate trench between fins 206 deepening the gate trench is referred to as trench 219. In forming trench 219, the foundational layer 202 material under fins 202 is generally retained. Trench 219 may lay entirely within the insulator layer of foundational layer 202 (e.g., if foundational layer is an SOI substrate, trench 219 does not protrude into the substrate and lays entirely within the insulator layer, etc.). Trench 219 may be 1 nm-100 nm deep.

The subtractive etching technique can be formed by a directional dry etch which can form substantially straight gate trench sidewalls or by a wet (or other isotropic) etch process which can form angled gate trench sidewalls. As such the depended bottom of the gate trench may be generally "U" shaped, "V" shaped, or the like. Certain subtractive etching techniques include lithography practices well known to those skilled in the art including: providing a mask layer upon the inter-layer dielectric 208, patterning the mask layer, and etching the patterned mask layer and partially etching the foundational layer 202. Exposure to the one or more etchants may be timed to remove merely a portion of the foundational layer 204 without removing the opposing spacers 218.

Figure 17:
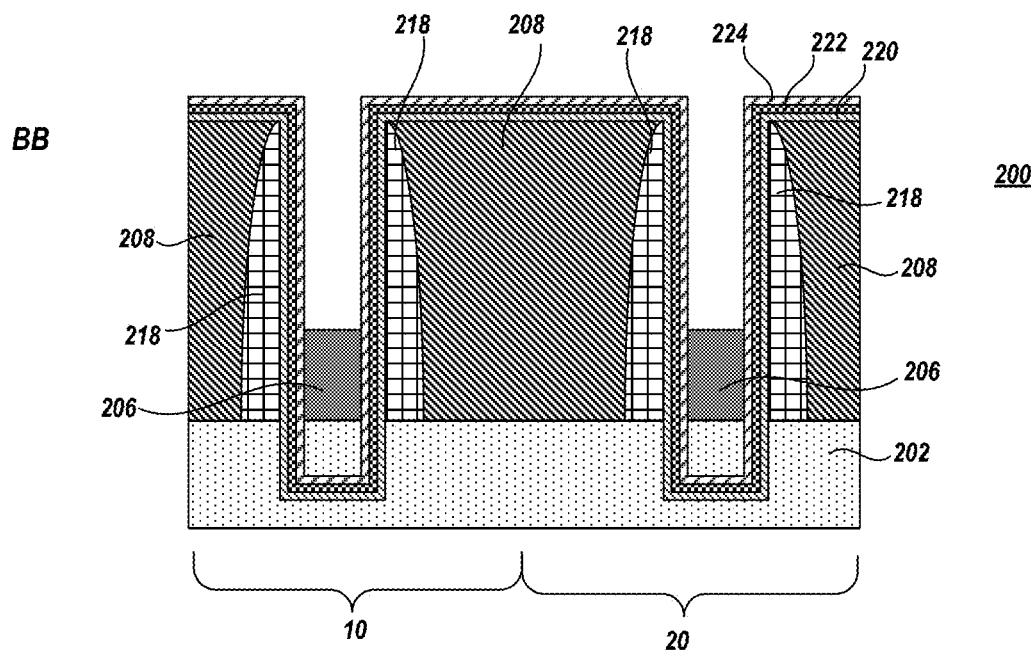

FIG. 17 depicts a gate cross section view of an exemplary semiconductor structure 200 at an intermediate stage of semiconductor device fabrication, in accordance with various embodiments of the present invention. At the present initial stage of fabrication, an oxide layer 220, a positive polarity dipole layer 222, and a liner layer 224 are formed. For clarity, structure 200 is depicted as cross section BB of dummy gate structure 210 generally between adjacent fins 206.

The oxide layer 220 may be formed by depositing silicon oxide upon the inter-layer dielectric 208 and upon the sidewalls of opposing spacers 218 and upon the recessed walls of the foundational layer 202 within gate trench. The oxide layer 220 may be formed by thin-film deposition methods, such as chemical vapor deposition, atomic layer deposition, and the like. The oxide layer 220 may have a thickness about 0.1 nm to about 3 nm. In embodiments, the thickness of oxide layer 220 is minimized.

Positive polarity dipole layer 222 may be formed by depositing a material inherently including a positive polarity upon the oxide layer 220. Such materials may include $GeO_2$, $Y2O_3$, $Lu_2O_3$, $La_2O_3$, SrO, or the like. A dipole is formed by the oxide layer 220 separating the positive polarity dipole layer 222 from negative polarity material of the foundational layer 202 in pFET region 10. This dipole upon the gate trench sidewalls reduces source to drain leakage current within pFET region 10. The positive polarity dipole layer 222 may be formed by thin-film deposition methods, such as chemical vapor deposition, atomic layer deposition, and the like. The positive polarity dipole layer 222 may have a thickness about 0.1 nm to about 3 nm.

Liner layer 224 may be formed by depositing a dielectric material, such as SiN, TaN, and TiN upon the positive polarity dipole layer 222. Liner layer 224 is capping layer which protect layer 222 from oxidation or reaction from following process. The liner layer 224 may be formed by thin-film deposition methods, such as chemical vapor deposition, atomic layer deposition, and the like. The liner layer 224 may have a thickness about 1 nm to about 10 nm.

Figure 18:
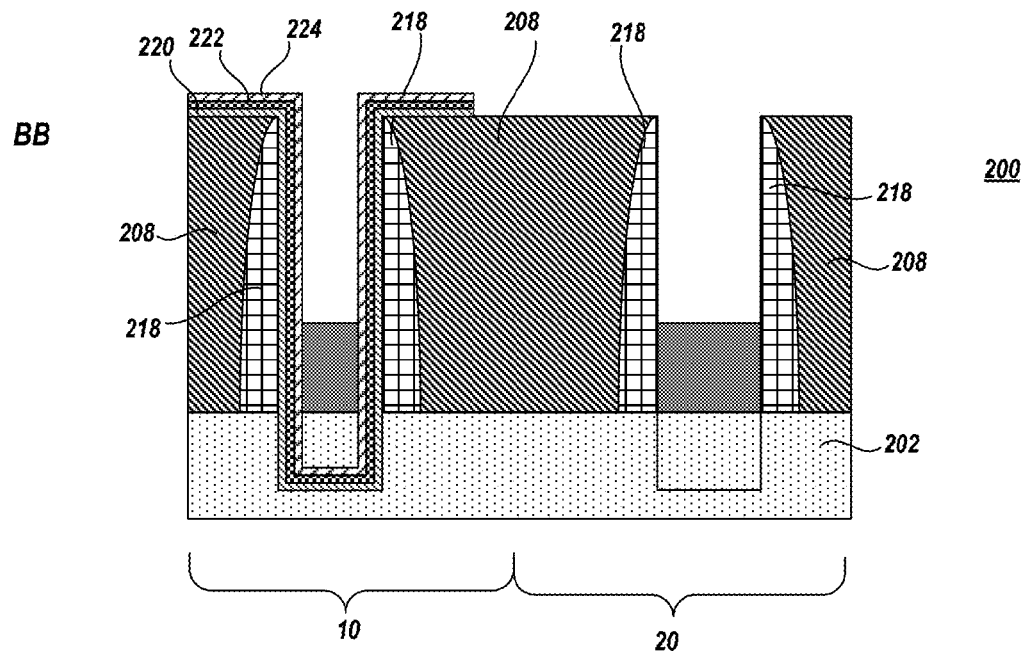

FIG. 18 depicts a gate cross section view of an exemplary semiconductor structure 200 at an intermediate stage of semiconductor device fabrication, in accordance with various embodiments of the present invention. At the present initial stage of fabrication, the gate trench in the pFET region 20 is exposed. For clarity, structure 200 is depicted as cross section BB of dummy gate structure 210 generally between adjacent fins 206.

The gate trench in the pFET region 20 may be exposed by depositing a dielectric material, such as silicon oxide, as a blanket mask layer upon the liner layer 224 and within the remaining gate trenches. The blanket dielectric material may be formed by CVD, spin coating, or the like. The blanket dielectric material generally protects a region of structure 200 while further processing may occur the other region of structure 200. For example, blanket dielectric material generally protects nFET region 10 while further processing may occur pFET region 20.

A subtractive etching technique, such as reactive ion etching (RIE), may remove portions of the blanket dielectric material, liner layer 224, positive polarity dipole layer 222, and oxide layer 220 within pFET region 20. Such etching technique may include multiple stages where an etchant removes the dielectric material and another etchant removes liner layer 224, positive polarity dipole layer 222, and/or oxide layer 220.

The subtractive etching technique can be formed by a directional dry etch which can form substantially straight sidewalls. A particular subtractive etching technique utilizes lithography practices well known to those skilled in the art including: providing the mask layer upon the liner layer 224, patterning the mask layer, etching the patterned mask layer and underlying materials, and removal of the mask layer. One or more known etchants may be utilized to remove the portions of the mask layer within pFET region 20, the dielectric material within pFET region 20, the liner layer 220 within pFET region 20, the positive polarity dipole layer 222 within pFET region 20, and the oxide layer 220 within pFET region 20. In other words, the gate trench within pFET region 20 may be exposed.

Figure 19:
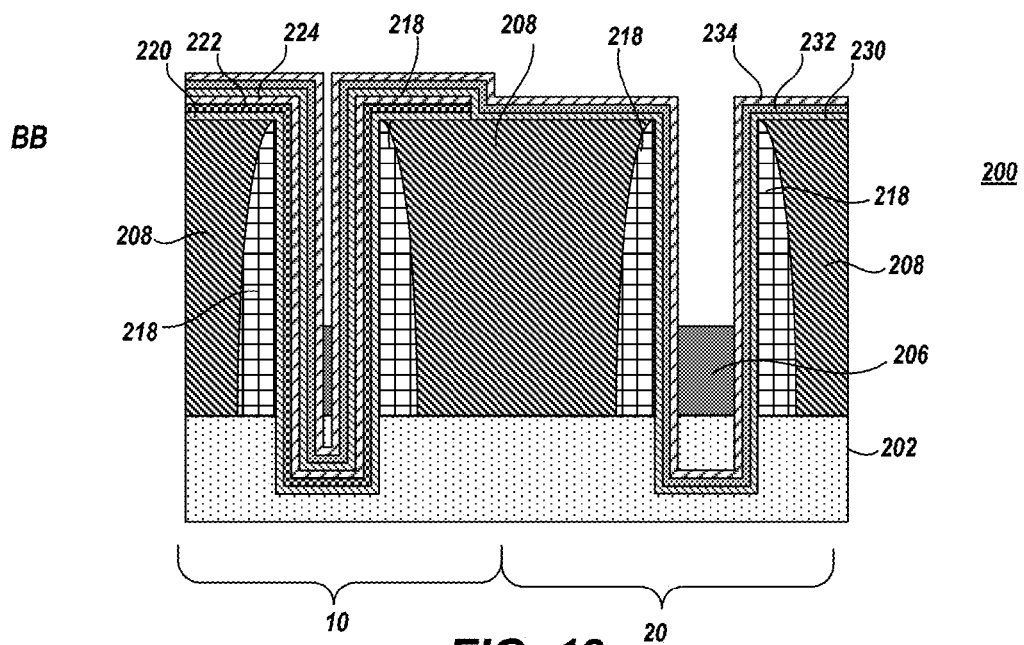

FIG. 19 depicts a gate cross section view of an exemplary semiconductor structure 200 at an intermediate stage of semiconductor device fabrication, in accordance with various embodiments of the present invention. At the present initial stage of fabrication, a dipole layered structure is formed within the gate trench in pFET region 20 and within the gate trench in nFET region 10. The dipole structure includes an oxide layer 230, negative dipole polarity layer 232, and liner layer 234. For clarity, structure 200 is depicted as cross section BB of dummy gate structure 210 generally between adjacent fins 206.

Oxide layer 230 may be formed upon at least the exposed sidewalls of the gate trench within pFET region 20 and within the gate trench within nFET region 10. The oxide layer 230 may be formed by depositing a silicon oxide material upon the upper surface of interlayer dielectric 208 within the pFET region 20 and upon the inner surfaces of the gate trench within pFET region 20, and upon the liner layer 218 within nFET region 10. The oxide layer 230 may be formed by thin-film deposition methods, such as chemical vapor deposition, atomic layer deposition, and the like. Oxide layer 230 may be the same thickness as oxide layer 220.

Negative polarity dipole layer 232 may be formed by depositing a material inherently including a negative polarity upon the oxide layer 230. Such materials may include $Al_2O_3$, $TiO_2$, $ZrO_2$, $HfO_2$, MgO, or the like. A dipole is formed by the oxide layer separating the negative polarity dipole layer 232 from the positive polarity material of the foundational layer 202. The negative polarity dipole layer 232 upon the gate trench inner walls reduces source to drain leakage current within pFET region 20. The negative polarity dipole layer 232 may be formed by thin-film deposition methods, such as chemical vapor deposition, atomic layer deposition, and the like. The negative polarity dipole layer 232 may have the same thickness as the positive polarity dipole layer 222.

Liner layer 234 may be formed by depositing a dielectric material, such as SiN, TaN, and TiN upon the negative polarity dipole layer 232. Liner layer 234 is capping layer which protect layer 232 from oxidation or reaction from following process. The liner layer 234 may be formed by thin-film deposition methods, such as chemical vapor deposition, atomic layer deposition, and the like. The liner layer 234 may have be the same thickness as liner layer 224.

Figure 20:
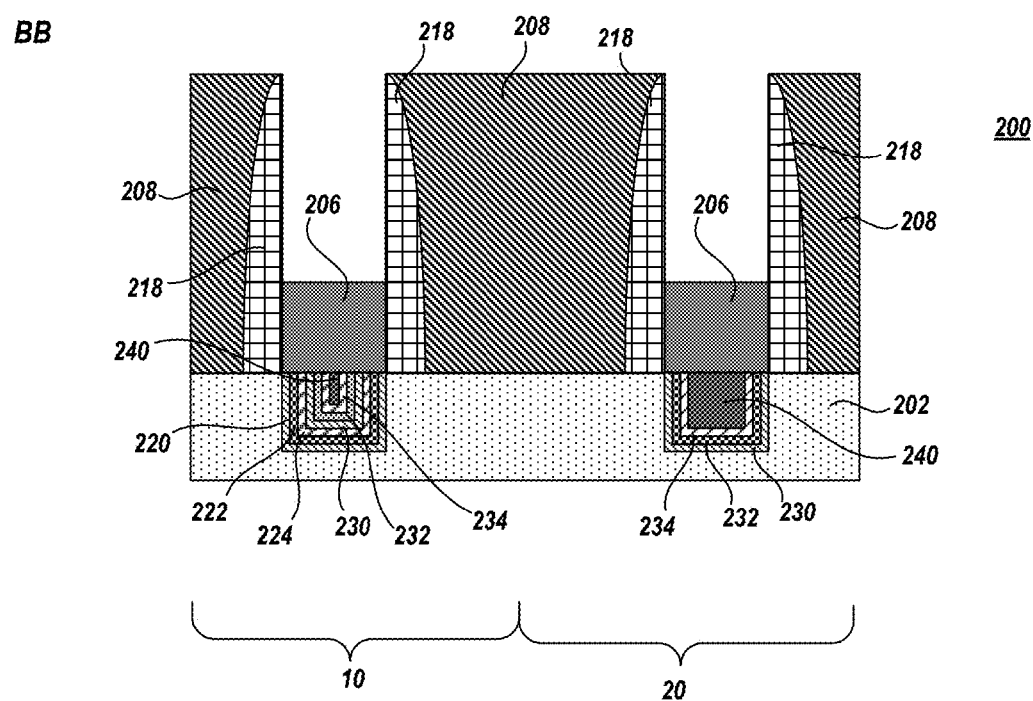

FIG. 20 depicts a gate cross section view of an exemplary semiconductor structure 200 at an intermediate stage of semiconductor device fabrication, in accordance with various embodiments of the present invention. At the present initial stage of fabrication, material within the gate trenches are partially recessed. For clarity, structure 200 is depicted as cross section BB of dummy gate structure 210 generally between adjacent fins 206.

Prior to partially recessing the material within the gate trenches, a blanket dielectric material may be formed by depositing a dielectric material, such as silicon oxide, upon the liner layer 224 in the nFET region 10 and the pFET region 20 and within the remaining fin trenches. The blanket dielectric material may be formed by CVD, spin coating, or the like. Overburden material may then be removed. More specifically, materials generally above the plane of the upper surface of inter-layer dielectric 208 may be removed by subtractive etching techniques, such as RIE, CMP, etc. The removal of the overburden material may include multiple stages.

Material within the gate trenches in the n-FET region 10 may be partially recessed by removing blanket dielectric material, liner layer 234 material, negative polarity dipole layer 232 material, oxide layer 230 material, liner layer 224 material, positive polarity dipole layer 222 material, oxide layer 220 material between the opposing spacers in n-FET regions 10. Material within the fin trenches in the n-FET region 10 may be partially recessed by removing blanket dielectric material, liner layer 234 material, negative polarity dipole layer 232 material, and oxide layer 230 material between the opposing spacers within the n-FET region 10.

Within the n-FET region 10, the remaining oxide layer 220 upon the recessed gate trench inner walls, the remaining positive polarity dipole layer 222 upon the oxide layer 220, the remaining liner layer 224 upon the positive polarity dipole layer 222, the remaining oxide layer 230 upon the liner layer 224, the remaining negative polarity dipole layer 232 upon the oxide layer 230, the remaining liner layer 234 upon the negative polarity dipole layer 232, the remaining blanket dielectric layer, are referred to as oxide layer 220' portion, positive polarity dipole layer 222' portion, liner layer 224' portion, oxide layer 230' portion, negative polarity dipole layer 232' portion, liner layer 234' portion, and dielectric 240, respectively.

Oxide layer 220' portion, positive polarity dipole layer 222' portion, liner layer 224' portion, oxide layer 230' portion, negative polarity dipole layer 232' portion, and the liner layer 234' portion may take on a similar shape as the bottom of the associated gate trench. For example, oxide layer 220' portion, positive polarity dipole layer 222' portion, liner layer 224' portion, oxide layer 230' portion, negative polarity dipole layer 232' portion, liner layer 234' portion, and/or dielectric 240 may have a general "U" shape, "V" shape, or the like. The oxide layer 220' portion and positive polarity dipole layer 222' portion forms a dipole with the negative polarity material of foundational layer 202 separated from dipole layer 222' portion by oxide layer portion 220'. The formed dipole reduces source to drain leakage associated with a replacement gate formed within the gate trench.

The respective top surfaces of oxide layer 220' portion, positive polarity dipole layer 222' portion, liner layer 224' portion, oxide layer 230' portion, negative polarity dipole layer 232' portion, liner layer 234' portion, and dielectric 240 exposed within the gate trench may be coplanar with the top surface of the foundational layer 202.

Material within the gate trenches in the p-FET region 20 may be partially recessed by removing blanket dielectric material, liner layer 234 material, negative polarity dipole layer 232 material, and oxide layer 230 material between the opposing spacers in n-FET regions 10. Material within the fin trenches in the p-FET region 20 may be partially recessed by removing blanket dielectric material, liner layer 234 material, negative polarity dipole layer 232 material, and oxide layer 230 material between the opposing spacers within the p-FET region 20.

Within the p-FET region 20, the remaining oxide layer 230 upon the recessed gate trench inner walls, the remaining negative polarity dipole layer 232 upon the oxide layer 230, the remaining liner layer 234 upon the negative polarity dipole layer 232, and the remaining blanket dielectric layer are referred to as oxide layer oxide layer 230' portion, negative polarity dipole layer 232' portion, liner layer 234' portion, and dielectric 240, respectively. Within p-FET region 20 oxide layer 230' portion, negative polarity dipole layer 232' portion, and liner layer 234' portion may take on a similar shape as the bottom of the associated gate trench. For example, oxide layer 230' portion, negative polarity dipole layer 232' portion, liner layer 234' portion, and/or dielectric material 240 may have a general "U" shape, "V" shape, or the like. The oxide layer 230' portion and negative polarity dipole layer 232' portion forms a dipole with the positive polarity material of foundational layer 202 separated from dipole layer 232' portion by oxide layer portion 230'. The formed dipole reduces source to drain leakage associated with a replacement gate formed within the gate trench.

The respective top surfaces of oxide layer 230' portion, negative polarity dipole layer 232' portion, liner layer 234' portion, and dielectric material 240 exposed within the gate trench may be coplanar with the top surface of the foundational layer 202.

Figure 21:
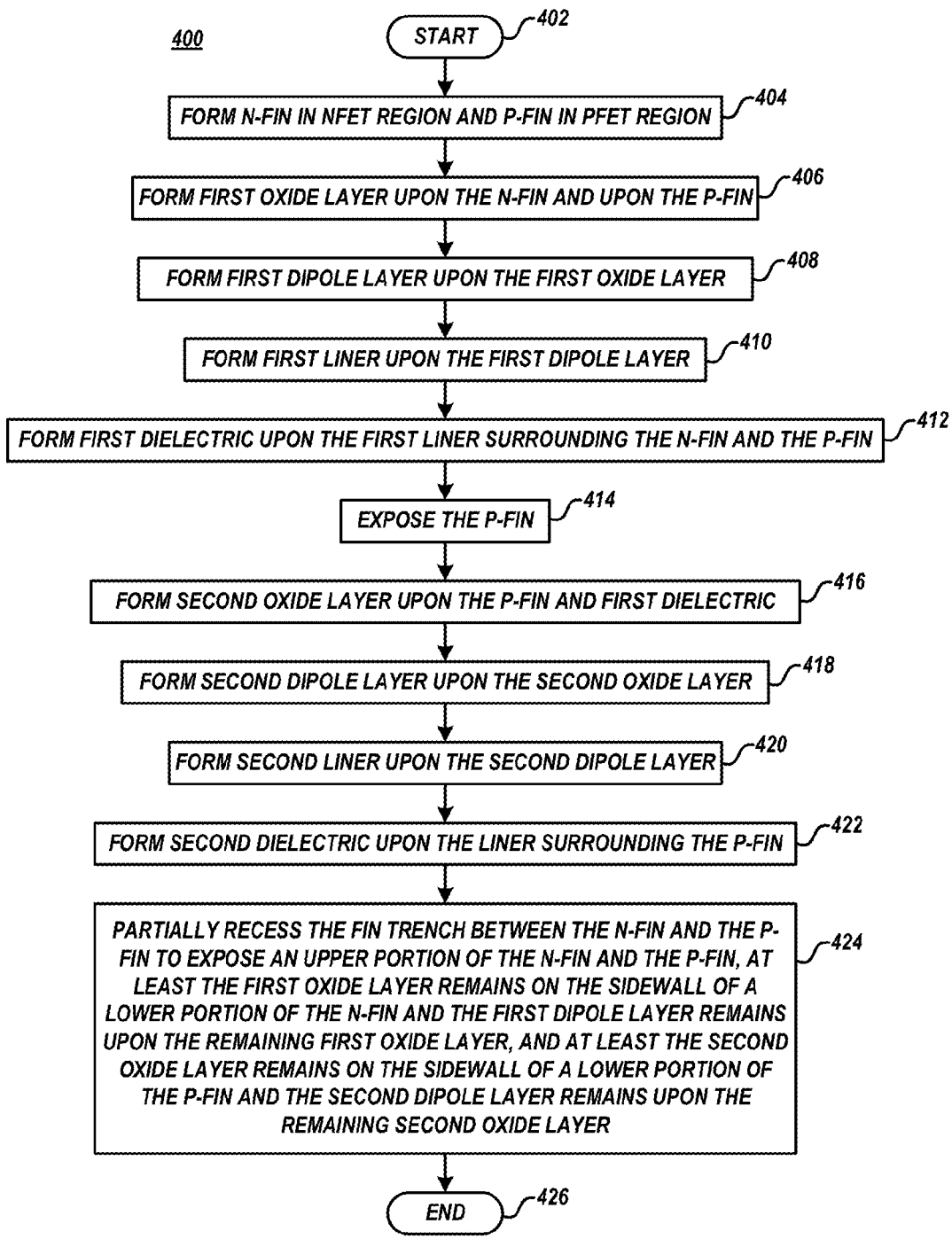
FIG. 21 and FIG. 22 depict exemplary semiconductor device fabrication processes, in accordance with various embodiments of the present invention.

FIG. 21 depicts an exemplary semiconductor device fabrication processes 400, in accordance with various embodiments of the present invention. Method 400 may be utilized to fabricate a FinFET semiconductor device (e.g., wafer, chip, integrated circuit, etc.) including a dipole structure formed within a fin trench generally a sidewall of a fin 120.

Method 400 begins at block 402 and continues forming an n-fin in a nFET region and a p-fin in a pFET region (block 404). For example fins 120 may be formed by removing portions of one or more layers upon a foundational layer 102, the portion of the one or more layers remaining forming fins 120. A fin 120 within n-FET region 10 may be doped with dopants such that a material of the fin 120 within n-FET region 10 includes a negative polarity. A fin 120 within p-FET region 20 may be doped with dopants such that a material of the fin 120 within p-FET region 10 includes a positive polarity.

Method 400 may further continue with forming a first oxide layer upon the n-fin and a first oxide layer upon the p-fin (block 406). For example, oxide layer 130 may be formed upon the sidewall of the n-fin and the sidewall of the p-fin. The oxide layer 130 may be formed by oxidation of the n-fin sidewall and p-fin sidewall material or the oxide layer 130 may be formed by deposition of silicon oxide upon the n-fin sidewall and the p-fin sidewall.

Method 400 may further continue with forming a first dipole layer upon the first oxide layer (block 408). For example, dipole layer 140 may be deposited upon the oxide layer 130. Method 400 may further continue with forming a first liner layer upon the first dipole layer (block 410). For example, liner layer 142 may be formed upon the dipole layer 140.

Method 400 may further continue with forming a first dielectric upon the first liner layer surrounding the n-fin and surrounding the p-fin (block 412). For example, dielectric material 150 may be deposited upon the liner layer 142 within the fin trench between the n-fin and the p-fin.

Method 400 may further continue with exposing the p-fin (block 414). For example, the dielectric material 150, the liner layer 142, the dipole layer 140, and the oxide layer 130 may be removed within the pFET region in the trench between the n-fin and the p-fin.

Method 400 may further continue with forming a second oxide layer upon the p-fin and first dielectric (block 416). For example, oxide layer 160 is formed upon the p-fin sidewall, within the fin trench between the n-fin and the p-fin, and upon the dielectric layer 150. Method 400 may further continue with forming a second dipole layer upon the second oxide layer (block 418). For example, dipole layer 170 is formed upon the oxide layer 160. Method 400 may further continue with forming a second liner upon the second dipole layer (block 420). For example, liner layer 172 may be formed upon the dipole layer 170.

Method 400 may further continue with forming a second dielectric upon the liner surrounding the p-fin (block 422). For example, dielectric material 180 may be formed upon the liner layer 172 within nFET region and may be formed upon liner layer 172 and within the fin trench within the pFET region.

Method 400 may further continue with partially recessing the fin trench between the n-fin and the p-fin to expose an upper portion of the n-fin and the p-fin, at least the first oxide layer remaining on the sidewall of a lower portion of the n-fin and the first dipole layer remaining upon the remaining first oxide layer, and at least the second oxide layer remaining on the sidewall of a lower portion of the p-fin and the second dipole layer remaining upon the remaining second oxide layer. (block 424). For example, the oxide layer 130, the dipole layer 140, the liner 142, dielectric material 150, the oxide layer 160, the dipole layer 170, the liner 172, and the dielectric 180 may be partially removed from the fin trench between the n-fin and the p-fin to expose an upper portion of the n-fin and the p-fin. A portion of oxide layer 130 remains on the sidewall of a lower portion of the n-fin and dipole layer 140 remains upon the remaining oxide layer 130 portion. An oxide 160 portion remains on the sidewall of a lower portion of the p-fin and the dipole layer 170 remains upon the remaining oxide layer 160 portion. In this manner, at least one dipole is formed by the oxide layer 130 separating the n-fin and the dipole layer 140 and at least one dipole is formed by the oxide layer 160 separating the p-fin and the dipole layer 170. Method 400 ends at block 426.

Figure 22:
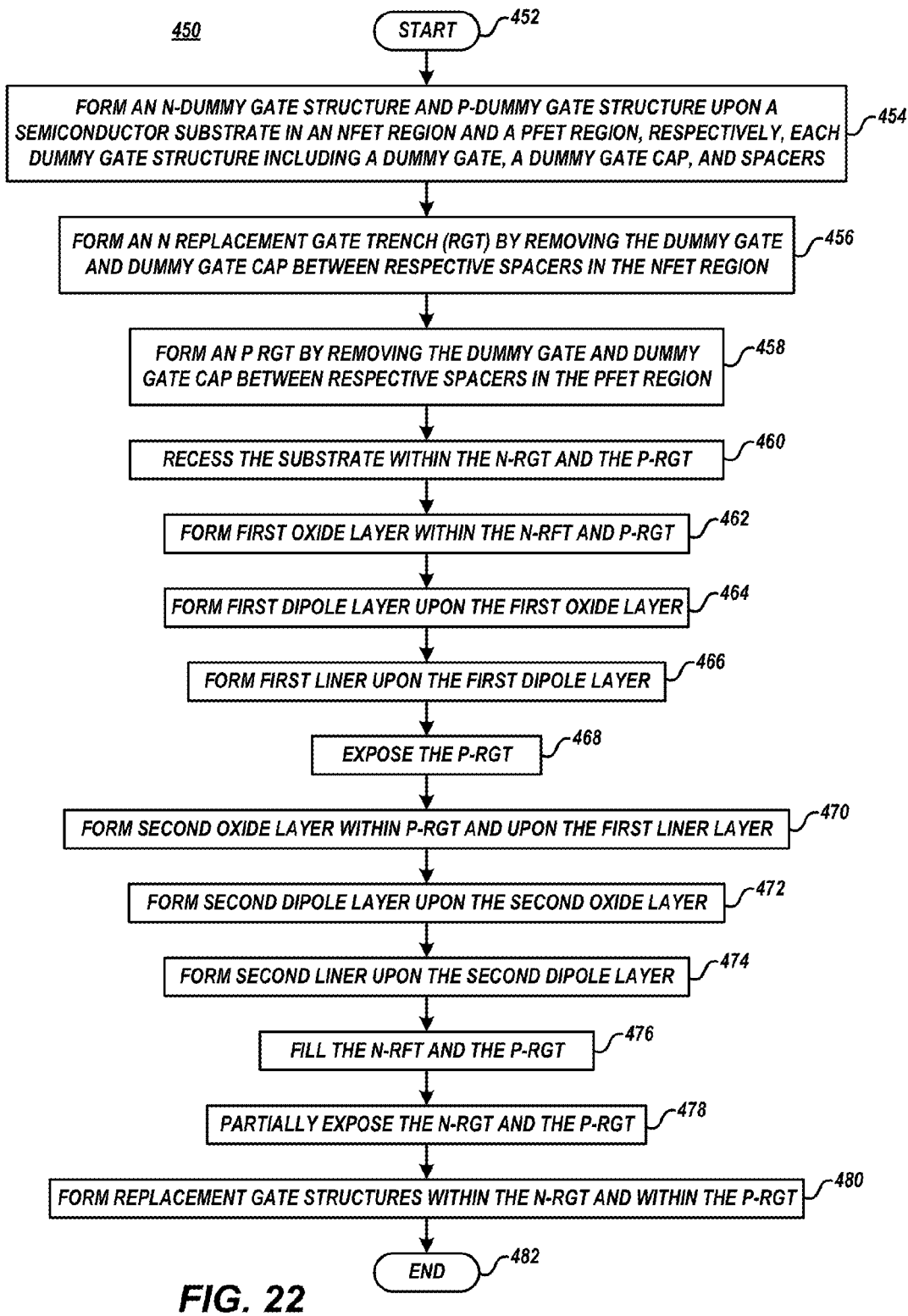
Figure 23:
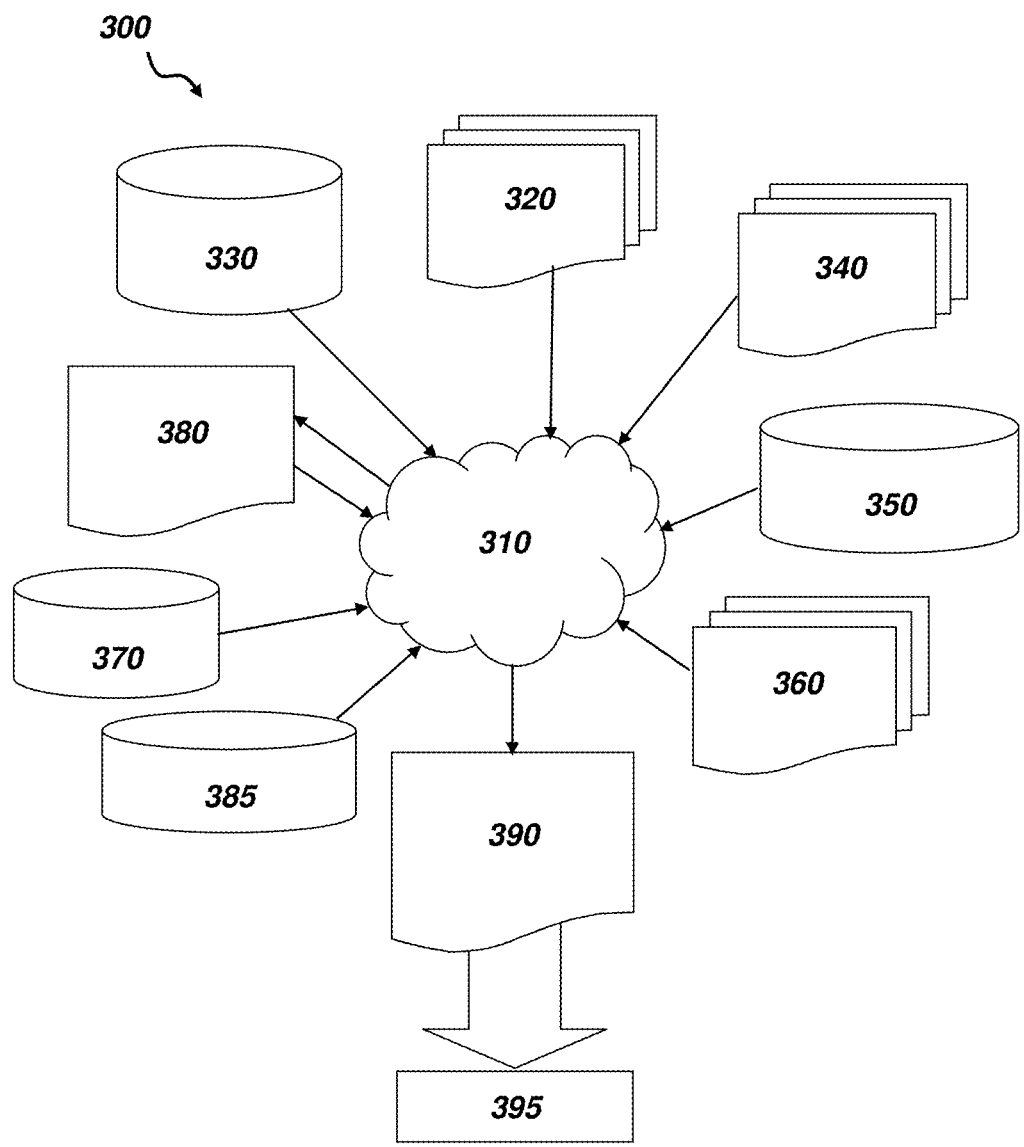
FIG. 23 depicts a flow diagram of a design process used in semiconductor design, manufacture, and/or test, in accordance with various embodiments of the present invention.

FIG. 22 depicts an exemplary semiconductor device fabrication processes 450, in accordance with various embodiments of the present invention. Method 450 may be utilized to fabricate a FinFET semiconductor device (e.g., wafer, chip, integrated circuit, etc.) including a dipole structure formed within a gate trench.

Method 450 may continue with forming an n-dummy gate structure and a p-dummy gate structure upon a semiconductor substrate in an nFET region and pFET region respectively. The n-dummy gate structure and the p-dummy gate structure includes a dummy gate formed upon a fin and upon the substrate, a dummy gate cap formed upon the dummy gate, and opposing spacers formed upon the sidewalls of the dummy gate and dummy gate cap (block 454). For example, a dummy gate material 214 may be formed upon foundational layer 202 and fin 206 and a gate cap 216 may be formed upon the dummy gate 214. Opposing spacers 218 are formed upon the sidewalls of the dummy gate 214 and gate cap 216. An interlayer dielectric material 208 layer may be deposited upon the foundational layer 202 and fin 206 abutting spacers 218.

Method 450 may continue with forming an n-replacement gate trench by removing the dummy gate and dummy gate cap between opposing spacers in the nFET region (block 456) and may continue with forming a p-replacement gate trench by removing the dummy gate and dummy gate cap between opposing spacers in the pFET region (block 458). For example, the dummy gate 214 and the cap 216 are removed between opposing spacers 218 forming a gate trench.

Method 450 may continue with recessing the substrate within the n-replacement gate trench and within the p-replacement gate trench (block 460). For example, the foundational layer 202 may be partially recessed within the gate trench. The recessing of the foundational layer 202 becomes part of the gate trench.

Method 450 may continue with forming a first oxide layer within the n-replacement gate trench and within the p-replacement gate trench upon the n-replacement gate trench and the p-replacement gate trench sidewalls and lower surface (block 462). For example, an oxide layer 220 is formed upon the gate trench sidewalls and bottom surface. The oxide layer 220 may also be formed upon the inter-layer dielectric material 208.

Method 450 may continue with forming a first dipole layer upon the first oxide layer (block 464). For example, a dipole layer 222 is formed upon the oxide layer 220. Method 450 may continue with forming a first liner layer upon the first dipole layer (block 466). For example, liner layer 224 may be formed upon the dipole layer 222. Method 450 may continue with exposing the p-replacement gate trench (block 468). For example, the liner layer 224, the dipole layer 222, and the oxide layer 220 may be removed from the pFET region 20.

Method 450 may continue with forming a second oxide layer within the exposed p-replacement gate trench and upon the first liner layer (block 470). For example, an oxide layer 230 may be formed upon the pFET region 20 gate trench sidewalls and bottom surface. The oxide layer 230 may also be formed upon the liner layer 224 in the nFET region 10. Method 450 may continue with forming a second dipole layer upon the second oxide layer (block 472). For example, dipole layer 232 may be formed upon oxide layer 230. Method 450 may continue with forming a second liner layer upon the second dipole layer (block 474). For example, liner 234 may be formed upon dipole layer 232.

Method 450 may continue with filling the remaining n-replacement gate trench and the remaining p-replacement gate trench (block 476). For example, a blanket dielectric material 240 may be deposited upon the liner 234. Method 450 may continue with partially exposing the n-replacement gate trench and the p-replacement gate trench (block 478). For example, in the p-FET region 20, the oxide layer 230 material, the dipole layer 232 material, the liner layer 234 material, and dielectric material 240 between the opposing sidewalls 218 are removed leaving oxide layer 230 material, dipole layer 232 material, liner layer 234 material, and dielectric material in the gate trench portion within foundational layer 202. In the n-FET region 10, the oxide layer 230 material, the dipole layer 232 material, the liner layer 234 material, dielectric material 240, oxide layer 220 material, the dipole layer 222 material, the liner layer 224 material between the opposing sidewalls 218 are removed leaving oxide layer 230 material, dipole layer 232 material, liner layer 234 material, dielectric material 240, oxide layer 220 material, dipole layer 222 material, liner layer 224 material in the gate trench portion within foundational layer 202.

Method 450 may continue with forming replacement gate within the n-replacement gate trench and within the p-replacement gate trench (block 480). For example, a replacement gate material may be formed upon the dipole structure(s) within the gate trench and a replacement gate cap may be formed upon the gate material between the spacers 218.

Referring now to FIG. 22, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-20.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 22 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-20. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-20 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-20. In one embodiment, design structure 390 may comprise a compiled, executable HDL simulation model that functionally simulates the devices shown in FIGS. 1-20.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-20. Design structure 390 may then proceed to a stage 395 where, for example, design structure 390: proceeds to tape-out, is released to manufacturing, is released to a mask house, is sent to another design house, is sent back to the customer, etc.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above may be used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

Unless described otherwise, or in addition to that described herein, "forming," "depositing," "deposited," etc. may include any now known or later developed techniques appropriate for the material to be deposited, including, but not limited to: chemical vapor deposition (CVD), laser plasma CVD (LPCVD), plasma enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the foundational layer, regardless of the actual spatial orientation of the foundational layer. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication method comprising:
    forming a negative polarity fin within an nFET region and a positive polarity fin within a pFET region;
    forming a fin-trench between the negative polarity fin and the positive polarity fin;
    forming a first dipole structure upon a sidewall of the negative polarity fin facing the fin-trench, the first dipole structure comprising a first oxide layer directly upon the negative polarity fin sidewall and a positive polarity dipole layer directly upon the first oxide layer;
    forming a first liner layer upon the positive polarity dipole layer, forming a first blanket dielectric layer upon the first liner layer, and exposing the positive polarity fin;
    subsequent to exposing the positive polarity fin, forming a second dipole structure upon a sidewall of the positive polarity fin facing the fin-trench, the second dipole structure comprising a second oxide layer directly upon the positive polarity fin sidewall and a negative polarity dipole layer directly upon the second oxide layer;
    forming a second liner layer upon the negative polarity dipole layer and forming a second blanket dielectric layer upon the second liner layer; and
    subsequent to forming the first the dipole structure and subsequent to forming the second dipole structure, exposing an upper portion of negative polarity fin sidewall and exposing an upper portion of the positive polarity fin sidewall by partially recessing the first oxide layer, the positive polarity dipole layer, the first liner layer, the first blanket dielectric layer, the second oxide layer, the negative polarity dipole layer, the second liner layer, and second first blanket dielectric layer within the fin trench.

2. The fabrication method of claim 1, wherein the first oxide layer is formed by oxidization of the negative polarity fin sidewall and wherein the second oxide layer is formed by oxidization of the positive polarity fin sidewall.

3. The fabrication method of claim 1, wherein the first oxide layer is formed by depositing an oxide upon the negative polarity fin sidewall and wherein the second oxide layer is formed by depositing an oxide upon the positive polarity fin sidewall.

4. The fabrication method of claim 1, wherein the second dipole structure is also formed upon the blanket dielectric layer within the nFET region.

5. A semiconductor device comprising:
    a negative polarity fin within an nFET region of the semiconductor device and a positive polarity fin within a pFET region of the semiconductor device;
    a fin-trench between the negative polarity fin and the positive polarity fin;
    a first dipole structure upon a sidewall of the negative polarity fin facing the fin-trench, the first dipole structure comprising a first oxide layer directly upon the negative polarity fin sidewall and a positive polarity dipole layer directly upon the first oxide layer;
    a first liner layer directly upon the positive polarity dipole layer, and a first dielectric material directly upon the first liner layer;
    a second dipole structure upon a sidewall of the positive polarity fin facing the fin-trench, the second dipole structure comprising a second oxide layer directly upon the positive polarity fin sidewall and a negative polarity dipole layer directly upon the second oxide layer;
    a second liner layer directly upon the negative polarity dipole layer, and a second dielectric material directly upon the second liner layer; and
    wherein a portion of the negative polarity dipole layer and a portion of the second liner layer separate the first dielectric material and the second dielectric material.

* * * * *